United States Patent
Chou et al.

(10) Patent No.: US 11,698,945 B2
(45) Date of Patent: Jul. 11, 2023

(54) ALL-TO-ALL CONNECTED OSCILLATOR NETWORKS FOR SOLVING COMBINATORIAL OPTIMIZATION PROBLEMS

(71) Applicant: Massachusetts Institute of Technology, Cambridge, MA (US)

(72) Inventors: Jeffrey Chou, Walnut Creek, CA (US); Suraj Deepak Bramhavar, Arlington, MA (US); Siddhartha Ghosh, Cambridge, MA (US); William Herzog, Bedford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 470 days.

(21) Appl. No.: 16/832,056

(22) Filed: Mar. 27, 2020

(65) Prior Publication Data
US 2022/0069771 A1    Mar. 3, 2022

Related U.S. Application Data

(60) Provisional application No. 62/826,080, filed on Mar. 29, 2019.

(51) Int. Cl.
*G06F 17/11* (2006.01)
*G06F 17/12* (2006.01)
*G06F 17/13* (2006.01)

(52) U.S. Cl.
CPC .............. *G06F 17/11* (2013.01); *G06F 17/12* (2013.01); *G06F 17/13* (2013.01)

(58) Field of Classification Search
CPC .......... G06F 17/11; G06F 17/12; G06F 17/13; G06F 17/10; G06F 17/00;
(Continued)

(56) References Cited

U.S. PATENT DOCUMENTS

| 2007/0001774 A1* | 1/2007 | Stevenson | G06F 1/324 331/158 |
| 2014/0159782 A1* | 6/2014 | Kennedy | H03B 5/1212 327/118 |

(Continued)

OTHER PUBLICATIONS

Sinha et al. "Enabling Resonant Clock Distribution with Scaled On-Chip Magnetic Inductors", 2009, IEEE, pp. 103-108. (Year: 2009).*

(Continued)

*Primary Examiner* — Mohamed Charioui
(74) *Attorney, Agent, or Firm* — Smith Baluch LLP

(57) ABSTRACT

An analog computing system with coupled non-linear oscillators can solve complex combinatorial optimization problems using the weighted Ising model. The system is composed of a fully-connected LC oscillator network with low-cost electronic components and compatible with traditional integrated circuit technologies. Each LC oscillator, or node, in the network can be coupled to each other node in the array with a multiply and accumulate crossbar array or optical interconnects. When implemented with four nodes, the system performs with single-run ground state accuracies of 98% on randomized MAX-CUT problem sets with binary weights and 84% with five-bit weight resolutions. The four-node system can obtain solutions within five oscillator cycles with a time-to-solution that scales directly with oscillator frequency. A scaling analysis suggests that larger coupled oscillator networks may be used to solve computationally intensive problems faster and more efficiently than conventional algorithms.

15 Claims, 20 Drawing Sheets

(58) Field of Classification Search
CPC .......... H03B 2200/0074; H03B 5/1215; H03B 5/1228; G06N 5/003; G06N 10/00
See application file for complete search history.

(56) References Cited

U.S. PATENT DOCUMENTS

| | | |
|---|---|---|
| 2014/0266480 A1* | 9/2014 | Li ................ H03B 5/1243 331/117 FE |
| 2014/0266892 A1 | 9/2014 | Schiller |
| 2015/0091617 A1* | 4/2015 | Zerbe ................ H03L 7/16 327/39 |
| 2017/0104493 A1 | 4/2017 | Goto |

OTHER PUBLICATIONS

Mirzaei et al. "The Quadrature LC Oscillator: A Complete Portrait Based on Injection Locking", Sep. 2007, IEEE Journal of Solid-State Circuits, vol. 42, No. 9, pp. 1916-1932. (Year: 2007).*

Kalia et al. "A Simple, Unified Phase Noise Model for Injection-Locked Oscillators" 2011, IEEE. (Year: 2011).*

International Search Report and Written Opinion in International Patent Application No. PCT/US2020/025271 dated Aug. 6, 2020, 11 pages.

Bhansali et al., "Gen-Adler: The generalized Adler's equation for injection locking analysis in oscillators," 2009 Asia and South Pacific Design Automation Conference, Yokohama, 2009, pp. 522-527, doi: 10.1109/ASPDAC.2009.4796533.

* cited by examiner

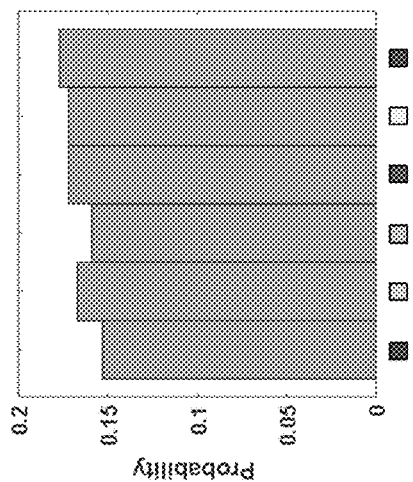
*FIG. 1D*
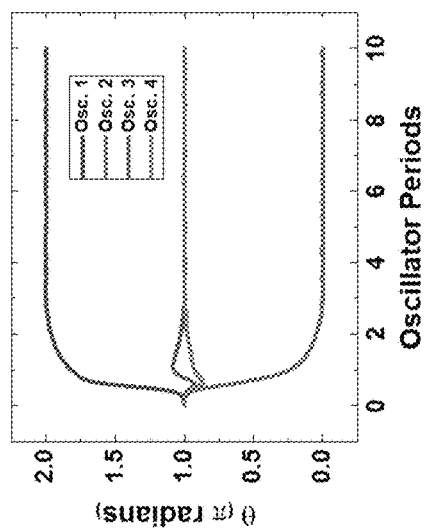
*FIG. 1C*
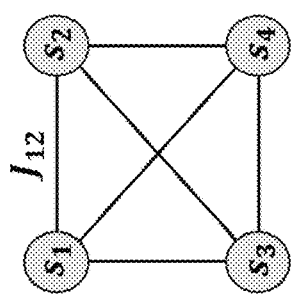
*FIG. 1B*
*FIG. 1A*

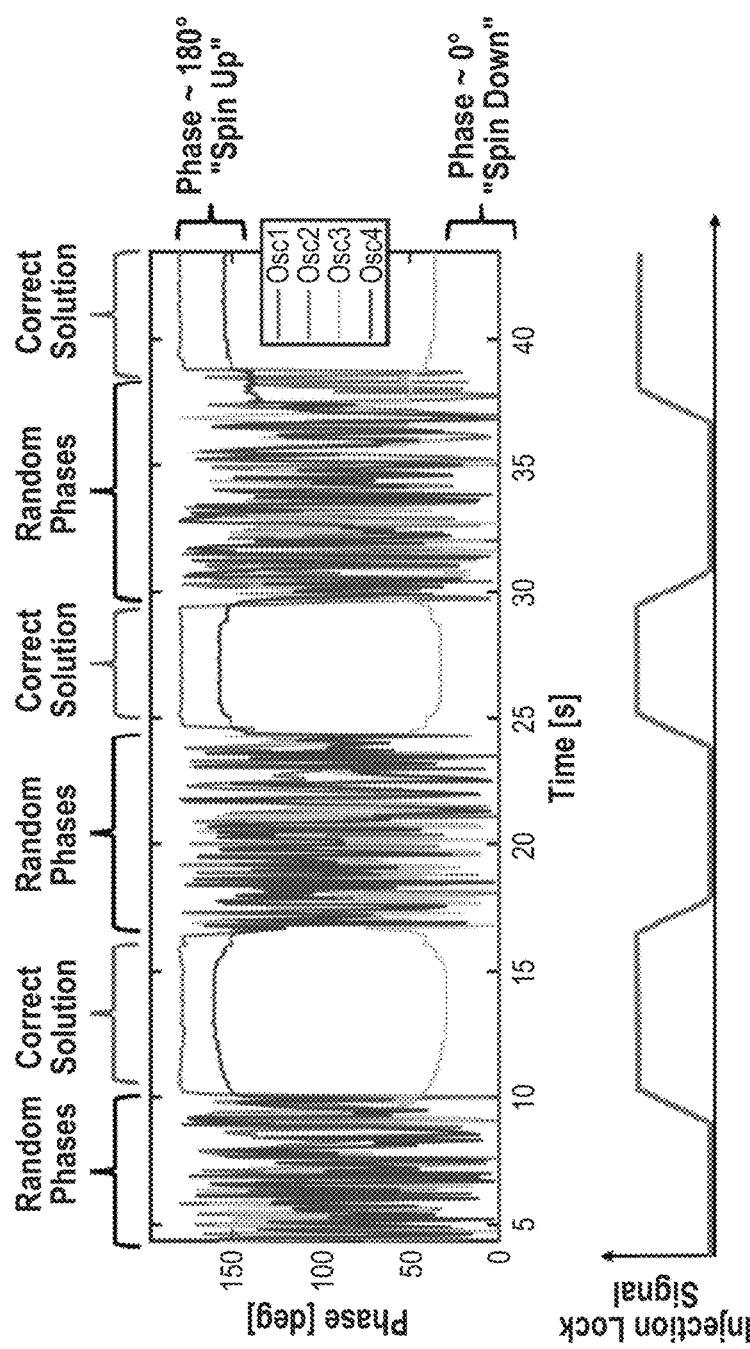
FIG. 4C
FIG. 4B
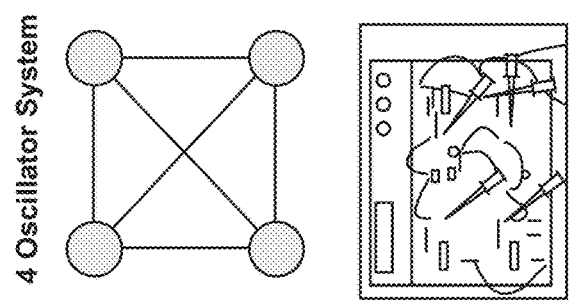
FIG. 4A

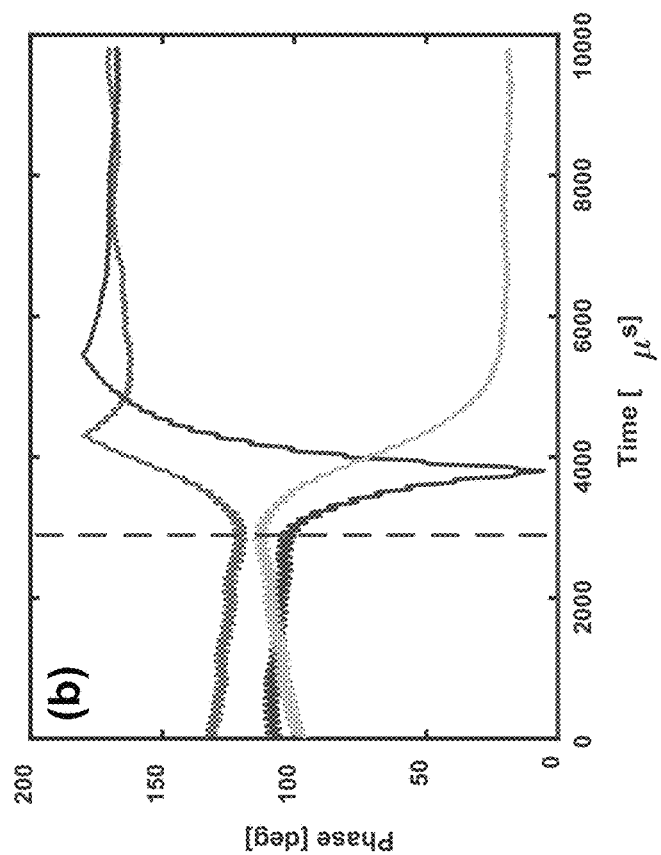
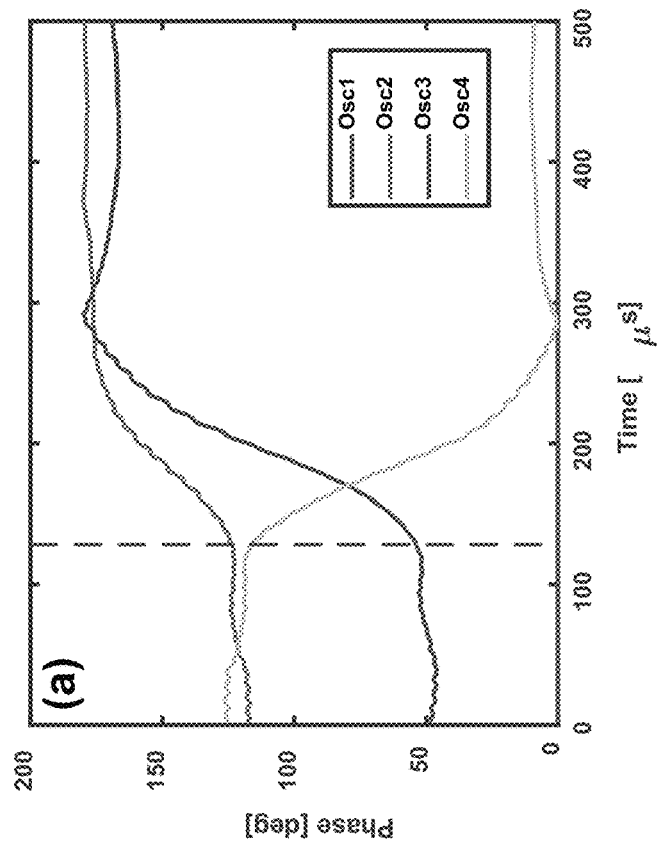
FIG. 11A
FIG. 11B

ALL-TO-ALL CONNECTED OSCILLATOR NETWORKS FOR SOLVING COMBINATORIAL OPTIMIZATION PROBLEMS

CROSS-REFERENCE TO RELATED APPLICATION(S)

This application claims the priority benefit, under 35 U.S.C. 119(e), of U.S. Application No. 62/826,080, entitled "All-to-All Connected Ising Machines with Free-Space Optical Interconnects" and filed on Mar. 29, 2019. Each of these applications is incorporated herein by reference in its entirety.

GOVERNMENT SUPPORT

This invention was made with government support under FA8702-15-D-0001 awarded by the U.S. Air Force. The government has certain rights in the invention.

BACKGROUND

Combinatorial optimization (CO) refers to a class of optimization problems in which standard computing techniques, such as an exhaustive search, become intractable. An example CO problem is the traveling salesman problem, in which the goal is to find the shortest route that connects a given list of cities. The field of CO spans many disciplines, including business operations, scheduling, traffic routing, finance, big data, drug discovery, artificial intelligence, machine learning, software engineering, drone management, resource allocation, and sensor data.

Solving certain classes of combinatorial optimization (CO) problems has proven to be notoriously difficult using standard von Neumann computing architectures. An alternative approach to solving a CO problem is to use quantum annealing, such as with a quantum processor like those commercialized by D-WAVE. However, D-WAVE's quantum processors require large cryogenic chambers to cool their superconducting qubits down to 4 K. Furthermore, due to hardware complexities, a sub-optimal interconnect scheme severely limits the performance of their hardware.

Recently, alternative classical methods to solve the Ising model have emerged using optoelectronic parametric oscillators, memristor cross-bar arrays, electronic oscillators, and graphics processing units (GPUs). An analysis of one such coupled oscillator system revealed the potential for a significant speed increase over digital computing processes at large node sizes. Even approaches which emulate nonlinear dynamical systems but are run on conventional computing hardware can match and even surpass the performance of state-of-the-art processes, motivating the desire to build these systems in physical hardware. Nevertheless, scaling up the optoelectronic oscillator Ising machine remains challenging owing to its time-multiplexed architecture and highly complex and costly optoelectronic setup.

The proposed systems closely resemble those described in the field of stochastic computing, where probabilistic representations of digital bits (p-bits) have been shown in simulation to be capable of solving invertible logic and combinatorial optimization problems. Analog implementations of these circuits typically rely on magnetic tunnel junctions, which could conceivably be implemented using standard CMOS technology, but a scalable physical implementation of this technology has yet to be realized.

In a similar vein, an all-electronic oscillator network introduces the tantalizing prospect of creating a similar system using readily available electronic components interconnected in a parallel fashion. Resistive coupling applies the connecting weights between the electronic oscillators, where the absolute resistance values determines the coupling weights. This set of electronic oscillators connected in parallel is particularly well suited for chip-scale integration and scaling using present day technologies. In this case, the p-bit is represented by the oscillator's phase, which can probabilistically settle to one of two values.

SUMMARY

CO problems can also be solved with arrays or networks of inexpensive coupled nonlinear electronic oscillators. Each nonlinear electronic oscillator in the network of nonlinear electronic oscillators is differentially coupled to each other nonlinear electronic oscillator in the network of nonlinear electronic oscillators. These arrays are compact and can operate at room temperature. They are also scalable, thanks in part to the interconnects, which enable each oscillator to communicate with every other oscillator simultaneously.

Each nonlinear electronic oscillator can be implemented as an injection-locked frequency divider circuit. And each injection-locked frequency divider circuit comprises first and second transistors in series with a resonant circuit. The first transistor has a first gate to receive a first input from another nonlinear electronic oscillator in the network of nonlinear electronic oscillators. And the second transistor has a second gate to receive a second input from the second nonlinear electronic oscillator. The first and second inputs drives the resonant circuit. The resonant circuit may comprise a pair of cross-coupled transistors in series with a pair of inductors and capacitors. It can provide a first output and a second output to the second nonlinear electronic oscillator.

Each nonlinear electronic oscillator may receive a coherent sum of signals from the other nonlinear electronic oscillator in the network of nonlinear electronic oscillators. A filter operably coupled to an input of a first nonlinear can remove a direct current (DC) portion of the coherent sum of signals. There may be an asymmetrically weighted connection between a first nonlinear electronic oscillator and a second nonlinear electronic oscillator in the network of nonlinear electronic oscillators. There may also be an (external) oscillator, operably coupled to each nonlinear electronic oscillator in the network of nonlinear electronic oscillators, to inject a super-harmonic injection-locking signal into each nonlinear electronic oscillator in the network of nonlinear electronic oscillators.

Such a network of nonlinear electronic oscillators can solve a CO problem as follows. Each nonlinear electronic oscillator emits an oscillating signal and receives a coherent sum of the oscillating signals from all of the other nonlinear electronic oscillators in the network of nonlinear electronic oscillators. Injecting an injection-locking signal into each nonlinear electronic oscillator causes the oscillating signal emitted by each nonlinear electronic oscillator to settle to a corresponding phase. Each coherent sum may be weighted by a corresponding weight based on the CO problem. If desired, the injection-locking signal, weight(s), or both can be adjusted to cause the corresponding phases of the nonlinear electronic oscillators to settle to a state which corresponds to the lowest energy state of the CO problem.

The interconnects between oscillators can be implemented as free-space optical interconnects. A first nonlinear oscillator in the array illuminates a diffuse reflector with a first multiplexed optical signal. The diffuse reflector scatters respective portions of the first multiplexed optical signal to the other nonlinear oscillators in the array. Each of these other nonlinear oscillators de-multiplexes the portion of the first multiplexed optical signal to form a first oscillator signal and weights the first oscillator signal with a corresponding first weight to form a corresponding first weighted signal. This first weighted signal can be injected into the nonlinear oscillator.

The weights can be set electronically. The signal is first distributed optically from one node to the other nodes in the system. The optical signal to each node has an individual modulation frequency, frequency shift, or similar identifier associated with it. Each receiving node then receives the optical signal and multiplies it by the desired weight associated with a particular transmit node. If the signals are frequency multiplexed, then a simple filter can be used to discriminate the signal coming from a particular transmit node. The strength of the filter dictates the weight.

Both electronically and optically coupled oscillators can be implemented as first, second, and third transistors in series a resonant circuit. The first transistor has a first gate to receive a first input from a second nonlinear oscillator in the plurality of nonlinear oscillators. The second transistor has a second gate to receive a second input from the second nonlinear oscillator. The first and second inputs drive the resonant circuit. The third transistor has a third gate to receive at least one of a direct current (DC) bias signal or an injection-locking signal. The oscillator may also include a fourth transistor and a fifth transistor, in series with the first transistor and the second transistor, to receive a bias signal from a voltage source.

The resonant circuit may include two cross-coupled transistors in series with a pair of inductors and capacitors. And the resonant circuit may be configured to provide a first output and a second output to the second nonlinear oscillator, in which case there may be a first high-pass filter, in series with the first gate and the second nonlinear oscillator, to weight the first input. A second high-pass filter, in series with the second gate and the second nonlinear oscillator, can weight the first input.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A is a schematic of a fully connected four-node nonlinear oscillator system.

FIG. 1B shows solution states of the degenerate four-node state for the MAX-CUT problem as solved by the four-node nonlinear oscillator system of FIG. 1A.

FIG. 1C shows a simulation of the phases of the four-node nonlinear oscillator system of FIG. 1A with initial conditions set to incorrect states.

FIG. 1D shows a probability distribution of solution states of the four-node nonlinear oscillator system of FIG. 1A after 1000 trials with randomized initial conditions.

FIG. 4A shows a four-node coupled nonlinear oscillator system solving the case with equal coupling weights for all four nodes.

FIG. 4B shows the amplitude of an injection-locking signal (e.g., a SHIL signal) used to drive the four-node coupled nonlinear oscillator system of FIG. 4A.

FIG. 4C shows experimental data from the four-node coupled nonlinear oscillator system of FIG. 4A in response to the injection-locking signal of FIG. 4B.

FIGS. 11A and 11B are plots of measured phase versus time during the last weight change, J34, for the four-node oscillator control system of FIG. 10A with 50 kHz and 5 kHz oscillators, respectively.

DETAILED DESCRIPTION

Figure 2B:
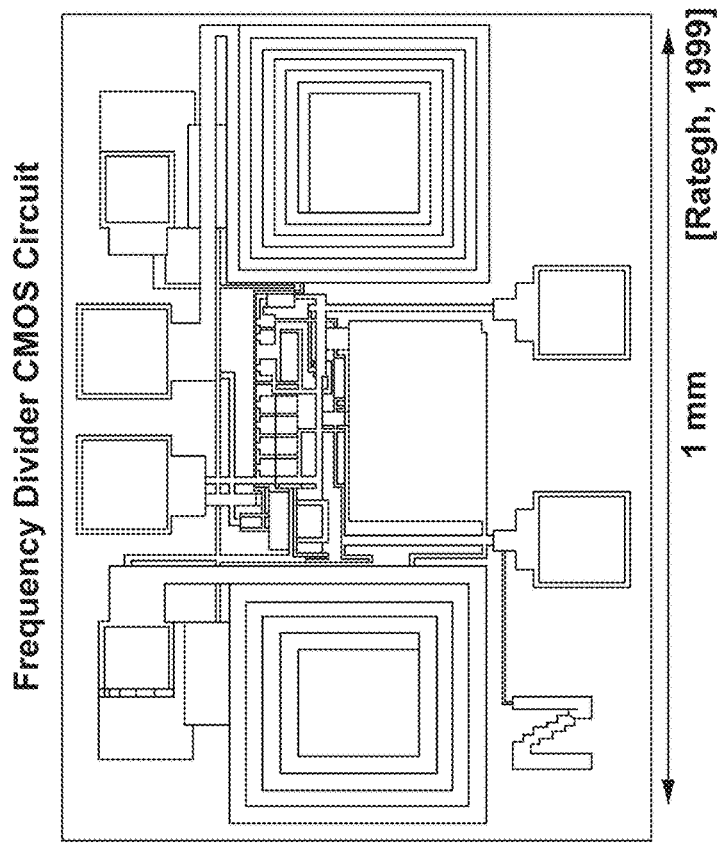
FIG. 2B is a photograph of a CMOS fabricated frequency divider (reproduced from Rategh et al., "Superharmonic injection-locked frequency dividers," IEEE Journal of Solid-State Circuits 34.6 (1999): 813-821).

A parallel, all-to-all connected coupled oscillator system that maps to the weighted Ising model can successfully solve random MAX-CUT problems with 98% success probability with binary weights. The system's accuracy varies as a function of the interconnect weight bit-resolution. Its performance maps accurately to stochastic differential equation (SDE) simulations, which predict the system behavior. At larger numbers of nodes, the system's performance scales favorably compared against other optoelectronic implementations and GPU-based algorithms for similar problem sets.

The coupled oscillator systems presented here are especially well-suited to integrated circuit implementations. One advantage of their advantages is their scaling with existing low-cost hardware. One challenge with scaling to larger numbers of nodes involves the interconnect architecture for densely connecting very large numbers of oscillators (e.g., >1000 oscillators). While time-multiplexed approaches have been implemented in recent instances, frequency- or code-division multiplexed systems can also be used to allocate connection resources efficiently.

Solving Combinatorial Optimization Problems with the Ising Model

CO problems can be solved using annealing, in which there are three main approaches: classical, simulated, and quantum annealing. Annealing can be used to solve for the ground state in the Ising model, which was originally developed as a mathematical model of ferromagnetism in reference to statistical mechanics. More generally, the Ising model represents a graph of interconnected binary spin states (up or down) with varying weights interconnecting all other spin states to each other. The Ising Hamiltonian is given by the following equation:

$$H = -\sum_{i,j}^{V} J_{ij} s_i s_j - \sum_{i}^{V} h_i s_i \tag{1}$$

where V represents the number of nodes in a particular problem set, $J_{ij}$ represents the weight values interconnecting the nodes, and $s=[s_i \ldots s_V]$ represents the solution space where $s_i$ is a binary spin state that can take the value of either +1 (spin ↑) or −1 (spin ↓).

Processes that can find the lowest energy state of the Ising Hamiltonian can, by extension, be used to solve other CO problems. The binary spin states can be represented physically with superconducting qubits, magnetic spin, optical parametric oscillators, or any other non-linear oscillators. Here, nonlinear electronic (LC) oscillators perform classical annealing.

One common benchmark optimization problem, known as the MAX-CUT problem, is defined by finding a bisection of an undirected graph which maximizes the cut set. This problem can be mapped directly to the Ising Hamiltonian above, with the solution to the problem being represented by the state s which minimizes H. A particular problem of interest is typically defined by a graph G(V,E), where V represents the number of vertices and E represents the number of edges.

FIGS. 1A-1D illustrate a four-node system and its behavior in solving the MAX-CUT problem. FIG. 1A shows the four-node system itself, with four nodes $s_1 \ldots s_4$, where every node is connected to every node. The connections are weighted with weights $J_{ij}$, where i and j are indices of the connected nodes. In general, a system with V nodes has $\Sigma_{i=1}^{V-1} i$ coupling weights. Put differently, in a system with V nodes, there are V(V−1) all-all connections. For a system with symmetric weighting between nodes—that is, when $J_{ij} = J_{ji}$, in the Ising Hamiltonian—there are V(V−1)/2 unique coupling weights. Thus, for V=4 and symmetric connections, there are 6 weights.

Setting $J=1$ for all connections and neglecting the Zeeman term in Eq. (1) (i.e., setting $h_i = 0$), gives a minimum solution defined by six degenerate 2×2 solution sets, shown in FIG. 1B. These nodes $s_1 \ldots s_4$ can be represented by a network of coupled nonlinear electronic oscillators whose phase dynamics are described by the Kuramoto model, which describes the behavior of a large set of coupled oscillators. In one version of the Kuramoto model, each oscillators is considered to have its own intrinsic natural frequency $\omega_i$, and each is coupled equally to all other oscillators. This fully nonlinear model can be solved exactly, in the infinite-V limit, with a clever transformation and self-consistency arguments. The Kuramoto model maps directly to the Ising Hamiltonian if the phases of these oscillators take values of either 0° or 180°.

One way to polarize the phases is to introduce an injection-locking signal at twice the natural frequency of the oscillators. This 'super-harmonic' injection locking signal and its application in the context of LC-oscillator systems is mathematically similar to the case of the degenerate optical parametric oscillator used in previous optical Ising machines, where optical pump pulses at twice the optical oscillation frequency are used to create binary phase values.

In the LC-oscillator system, the phase evolution of each LC oscillator in the system ($\theta_i(t)$) can be represented by the following differential equation:

$$\frac{d\theta_i}{dt} = -\sum_{j=1}^{V} J_{ij}\sin(\theta_i(t) - \theta_j(t)) - A(t)\sin(2\theta_i(t)) \quad (2)$$

where V is the total number of oscillators (or vertices) and A represents the amplitude of the injection-locking signal applied to each oscillator. The time t in Eq. (2) is defined in dimensionless units in relation to the oscillation period. The addition of Gaussian phase fluctuations, representing noise in the system, converts equation Eq. (2) into a network of stochastic differential equations (SDEs), whose solutions can be approximated iteratively using the Euler-Maruyama method. Annealing is accomplished by gradually increasing the injection locking term A according to the formula:

$$A(t) = A_0\left(1 - e^{-\frac{t}{\tau}}\right) \quad (3)$$

with $\tau$ set to 5 oscillation cycles.

FIG. 1C shows one solution simulated for the problem described above, where the initial condition was intentionally selected to be an incorrect solution state (s=[↑↑↑↑]). Even in this scenario, the oscillator phases evolve to settle at one of the six correct solutions (s=[↓↓↑↑]). The system settles to the ground state within three oscillation cycles. This simulation was then run 1000 times with randomized initial conditions, and the system always settles to a correct solution state with fairly uniform probability as shown in FIG. 1D. The average settling time for the 1000 trials was 2.3 oscillation cycles.

One practical challenge in using nonlinear electronic oscillators lies in the hardware interconnections between the binary spin states (represented by the nonlinear electronic oscillators). In an all-to-all interconnect scheme like the one shown in FIG. 1A, all spins states (nonlinear electronic oscillators) are connected to all other spin states (nonlinear electronic oscillators) with unique weights for each connection. However, the number of spin states (and therefore the number of nonlinear oscillators), V, can exceed 10,000 for useful problems. Practically, this means the system should have >10,000 individual wires for each spin state—a requirement that is very challenging with conventional electronics.

LC Oscillators and Super-Harmonic Injection Locking (SHIL)

Figure 2A:
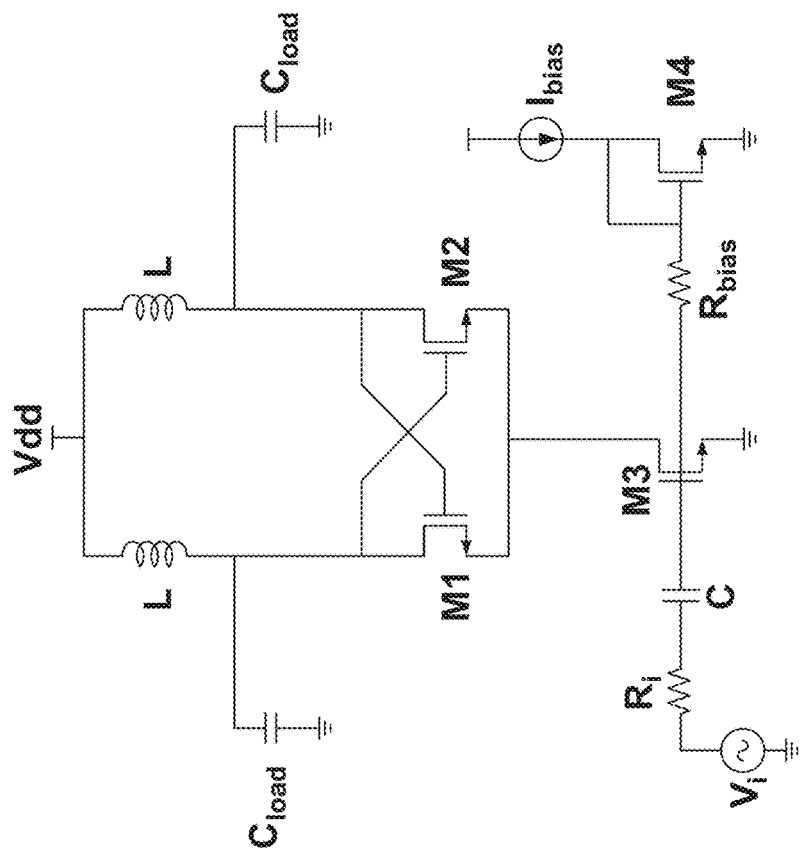
FIG. 2A is a circuit diagram of an injection-locked LC oscillator, also known as a frequency divider circuit.

FIGS. 2A and 2B show a circuit diagram and an image, respectively, of an LC oscillator, also known as a frequency divider circuit, that can be used to represent a binary spin state. This injection-locked frequency divider circuit relies on a cross-coupled pair of transistors M1 and M2 to provide negative feedback to the LC oscillators (differential). Any non-linear oscillator can be used, such as a metronome, MEMS oscillator, NEMS oscillator, laser, or optical parametric oscillator, to name a few. LC oscillators are particularly advantageous because they can be fabricated with traditional integrated microelectronics techniques. These techniques can be used to make LC oscillator arrays with small sizes, large numbers of oscillators, and low production cost.

For a nonlinear oscillator to exhibit the binary states of the Ising model, it should undergo super-harmonic injection locking (SHIL), in which a driving signal at twice the natural frequency, $2f_0$, is injected into the oscillator. This condition puts the oscillator into a bi-stable state, where the phase is either 0° or 180°.

Figure 3:
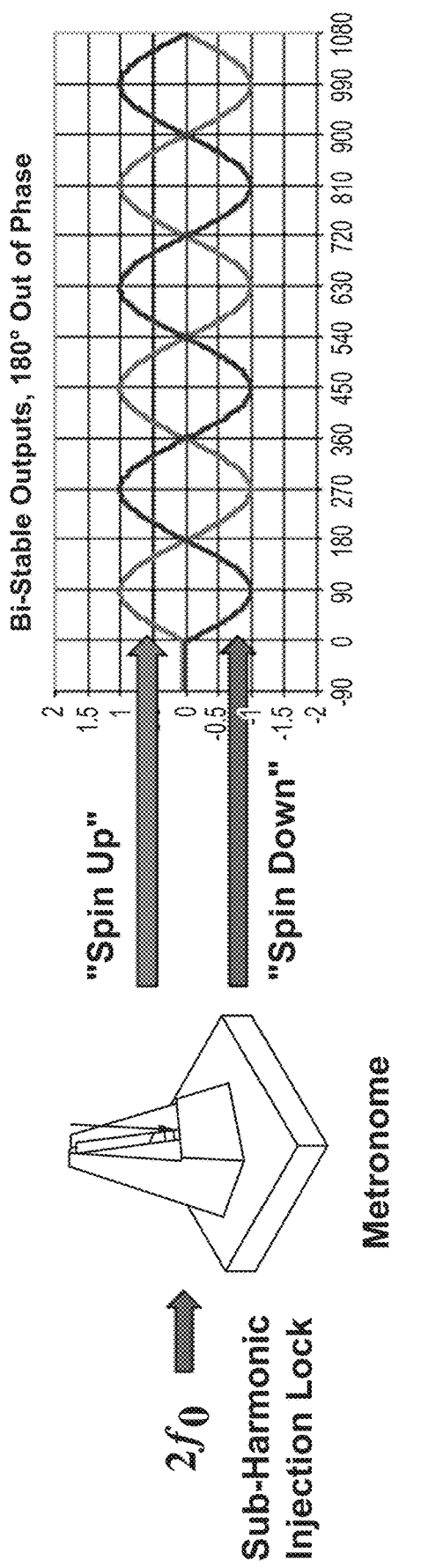
FIG. 3 illustrates super-harmonic injection locking (SHIL), which forces a bi-stable phase state of any nonlinear oscillator.

FIG. 3 shows the idea of SHIL: a nonlinear oscillator, represented by a metronome, is driven at by an injection-lock signal at twice its natural frequency to produce either a spin-up output or a spin-down output that is 1800 out of phase with the spin-up output. For the circuit shown in FIG. 2A, the injection-lock signal is inserted at the gate of the M3 transistor. The output oscillation voltage (the spin-up or spin-down output) is measured across the capacitor and inductor in the circuit shown in FIG. 2A. In FIG. 2A, the voltage can be measured across $C_{load}$; in FIGS. 5A and 5B (described below), the output oscillation voltage can be tapped at the output of VoR or VoL.

FIGS. 4A-4C illustrate the performance of coupled nonlinear oscillators with and without a super-harmonic injection-lock (sinusoidal) signal at 100 kHz generated by another oscillator, such as a function generator. FIG. 4A shows a four-node coupled oscillator system like the one in FIG. 1A, where the circles represent SHIL oscillators (nodes) and the lines represent weighted connections between nodes. The system includes one potentiometer (not shown) for each weighted connection (six potentiometers total) for tuning the coupling weights between the SHIL oscillators. The resonant frequency of the oscillators is 50 kHz, and the potentiometers were set to 50 kΩ (i.e., equal coupling weights for all four nodes) and driven with the injection-locking signal whose amplitude is shown in FIG. 4B. The plot in FIG. 4C shows the phases of all four oscillators versus time, as they reach the correct solution as a function of the injection-locking signal in FIG. 4B. Two of the oscillators reach near 180° while the other two remain near 0°.

The system of FIGS. 4A-4C, with resistors doing the coupling, can be used to solve the Ising problem or other similar problems by either (a) slowly reducing the resistance uniformly among all the oscillators or (b) slowly turning up the injection-locking signal to all the oscillators. Over time, the phases of the oscillators settle to a state which corresponds to the solution of the particular problem being solved.

Differential Oscillator Coupling

Figure 5A:
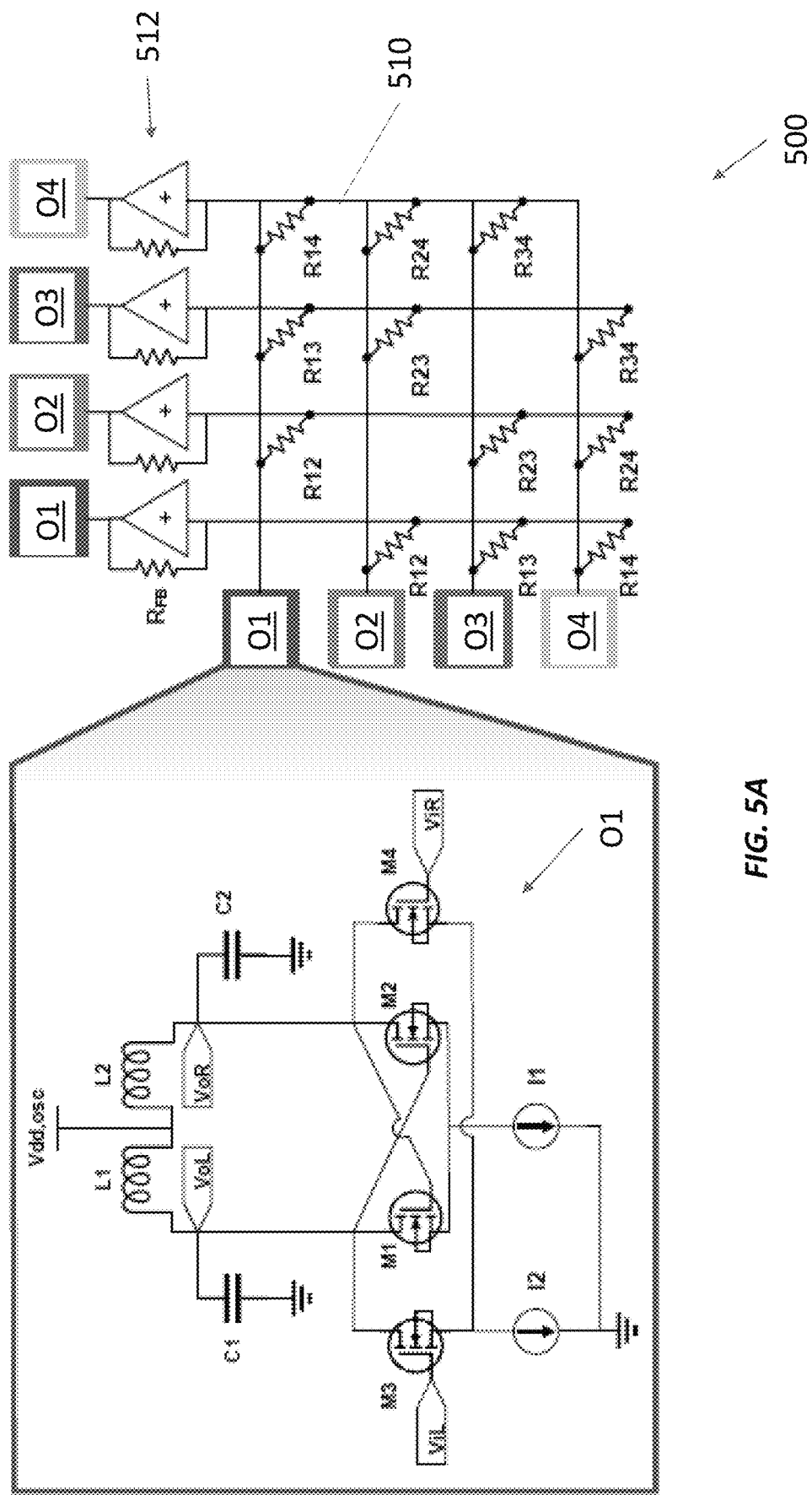
FIG. 5A shows a circuit diagram of an LC oscillator circuit (left) coupled to three other LC oscillator circuits via a multiply and accumulate crossbar array composed of digital potentiometers, where the input coupling is inserted at the gates of transistors M3 and M4.
Figure 5B:
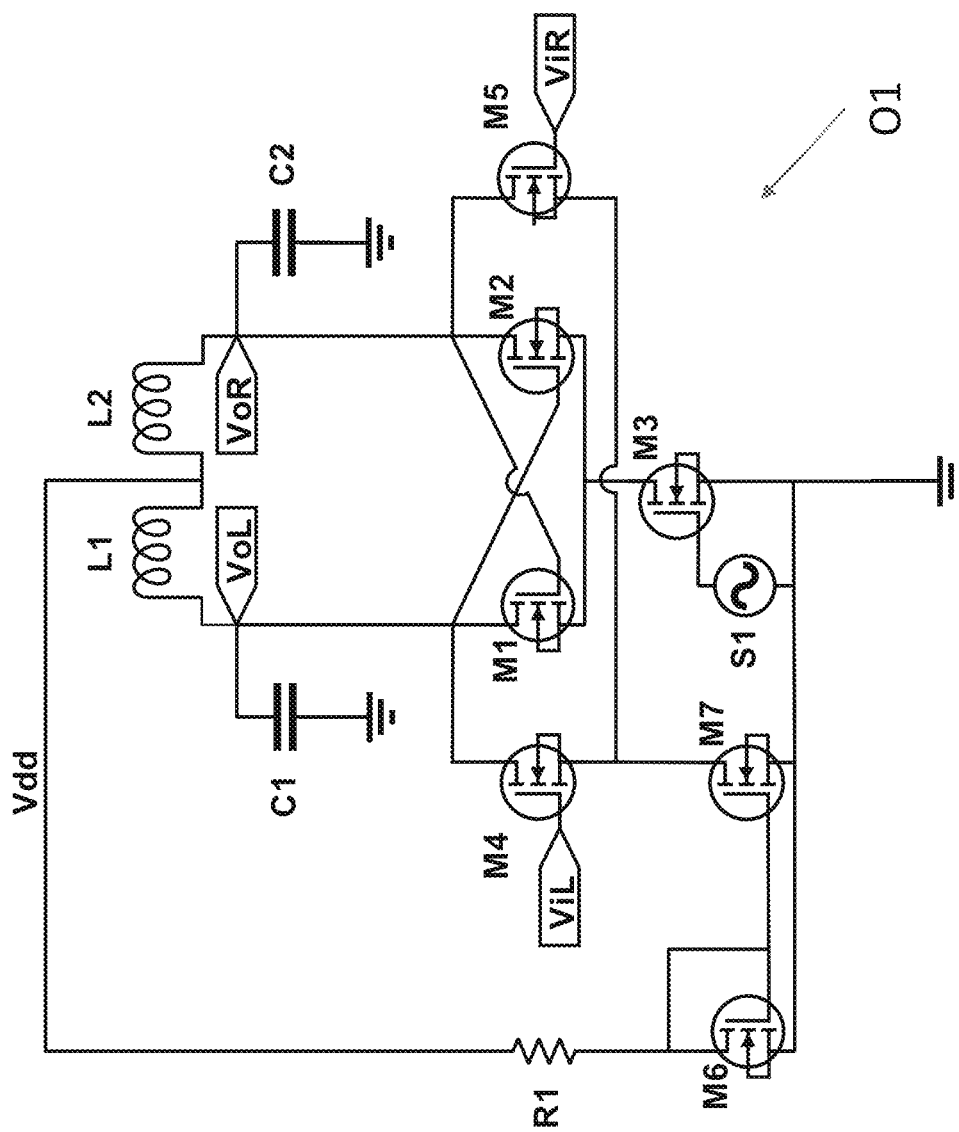
FIG. 5B shows another view of the differential coupling oscillator circuit of FIG. 5A, where the inputs are shown in nodes ViL and ViR and the current sources are shown as transistors.

FIG. 5A shows an all-to-all coupled oscillator network 500 with four nodes implemented as LC oscillators O1-O4 and coupled together using a differential coupling scheme. Oscillator circuit O1 appears at left in FIG. 5A and in greater detail in FIG. 5B and employs a differential injection-locked frequency divider topology. (The other oscillators O2-O4 may be implemented with the same circuit as oscillator O1.) This architecture offers the option of synchronizing the oscillator O1 with an incident super-harmonic injection-locking (SHIL) signal generated by an oscillator, such as an external function generator or by a frequency-doubled oscillator on the same chip as the oscillator network 500. This SHIL signal can be applied where the current source I1 is drawn in FIG. 5A. FIG. 5B shows an oscillator S1 (e.g., a function generator) that produces the alternating current (AC) SHIL signal feeding the gate of transistor M3. A bias voltage feeds the gate of transistor M7 (abstracted as current source I2 in FIG. 2) to tune the coupling.

Transistors (e.g., Supertex TN0702) M1 and M2 form a cross-coupled pair, which serves as the negative resistance component for unity loop gain. The coupling signal from the other oscillators O2-O4 is applied differentially through transistors M3 and M4. Transistors M7 and M6 (FIG. 5B) act as a current source 12 (FIG. 5A) for the oscillator's coupling nodes.

This specific coupling circuitry is typically used for quadrature LC oscillators and employs an injection-locking based coupling scheme, which can be mapped to the generalized Adler's equation and to the Kuramoto model. Current source 12 provides the bias current for the coupling signal. The output voltage of the oscillator O1 is tapped at nodes VoL and VoR, directly out from the oscillating LC tank (L=100 µH, C=0.1 µF). The LC tank circuit has a resonant frequency of 50 kHz, and is composed of inductor L1, capacitor C1, and inductor L2, capacitor C2. Current source I1 provides a biasing current for the oscillator circuit and can also be used for injection locking to help polarize the phases to 0° and 180°.

One difference between the resistive coupling scheme and the differential coupling scheme in FIG. 5A is how the coupling signals are coupled to each oscillator O1-O4. In the resistive coupling scheme, current is injected only when a voltage difference exists between a pair of coupled oscillator nodes. The differential coupling scheme directly adds the current from the other oscillators, which enables a coherent addition of the input signals to each of the oscillators.

FIG. 5A also shows a differential analog multiply and accumulate circuit 510 that applies signals into input nodes ViL and ViR of each oscillator. The coupling coefficient polarity is controlled by the polarity of the output of a corresponding differential summing amplifier 512 (e.g., a Texas Instruments THS4140) to the nodes ViR and ViL. Each differential summing amplifier 512 is in parallel with a corresponding feedback resistor, $R_{FB}$=1 kΩ. Digital potentiometers (e.g., Analog Devices AD5272) R12 through R34 control the individual gains of each of the input oscillator signals.

One advantage of this interconnect differential analog multiply and accumulate circuit 510 versus a resistive interconnect circuit stems from the ability to scale the number of fully-connected nodes O1-O4 without adding resistive loading to each oscillator O1-O4 by using a simple buffer circuit. And unlike with resistive coupling, the quality factor Q for each oscillator should stay constant as the number of oscillators because the buffer should protect the oscillators from the loading effects. The actual gain term is determined by the ratio of the feedback resistor, $R_{FB}$=1 kΩ, and the digital potentiometers R12 through R34. A processor (e.g., an Arduino microcontroller board) applies digital I2C communication signals to the digital potentiometers R12 through R34. Precise tuning of the bias voltages for the oscillators O1-O4 and coupling circuit 510 ensures accurate solution performance of the system 500.

The analog coupling coefficients from the Ising Hamiltonian ($J_{ij}$) are mapped linearly to the ratio of the gains between the various oscillators. The digital potentiometers employed here have 1024 tap points, with a maximum resistance of 20 kΩ. The conversion from the analytical coupling coefficients to the digital potentiometer's programmed values ($D_{ij}$), which range from 1 to 1024, is shown the following equation:

$$D_{ij} = \frac{\beta\alpha}{J_{ij}} + \beta(1-\alpha) \qquad (4)$$

where $\beta = R_{min}*1024/20$ kΩ and a is the mapping scalar. (For the results disclosed here, α=2.5.) Setting the minimum resistance to $R_{min}$=760Ω prevents high currents at the summing amplifier at high coupling coefficient values. The mapping from the coupling coefficients, $J_{ij}$, to the resistance values is scaled based on the a term to enable maximum dynamic range.

Figure 6B:
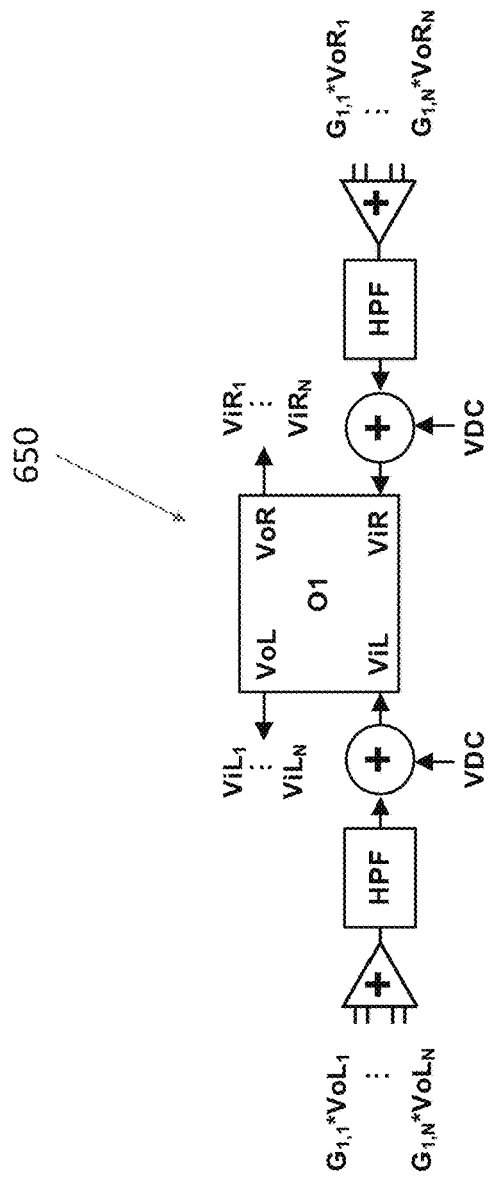
FIG. 6B shows an all-to-all connected oscillator circuit, where the weights of each oscillator are applied in the $G_{n,m}$ factors, a high-pass filter (HPF) eliminates the summed DC voltage of each input, and a VDC voltage is added to the signal as a controlled bias independent of the number of input nodes.
Figure 6A:
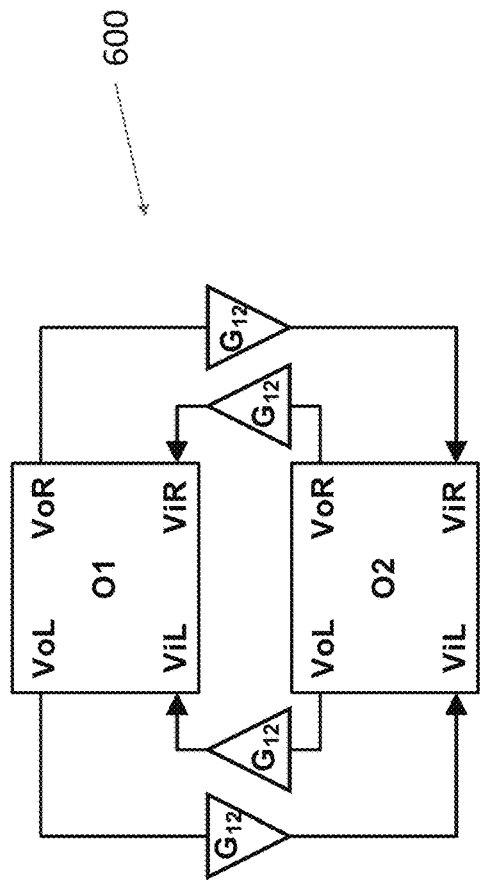
FIG. 6A is a high-level illustration of a two-node system, where each node is an LC oscillator, and the coupling configuration between the nodes, with the coupling weight between the two nodes represented by a gain term $G_{12}$.

FIGS. 6A and 6B show generalized views of differential coupling in two-node system 600 and a system 650 with an arbitrary number of nodes, respectively. Each node can be implemented as the circuit shown at left in FIG. 5A. In the two-node system 600 of FIG. 6A, the VoL and VoR output voltages of oscillator O1 are connected to the ViL and ViR inputs of O2 and vice versa via weighted connections $G_{12}$. These weighted connections can be adjusted independently of each other, e.g., $G_{21}$ does not have to equal $G_{12}$.

FIG. 6B shows a first oscillator O1 in the system 650 with all-to-all coupling for fully coupling N oscillators. The output voltages VoL and VoR from each oscillator are distributed to all other oscillators in the system 650. On the receive end, each received voltage signal is weighted by a gain term, $G_{n,m}$. The signals are added and passed through a high pass filter (HPF) to remove the summed DC voltage values, which scale with N oscillators. A VDC bias voltage is added to enable a controlled bias voltage. The controlled bias voltage allows the receiver to eliminate low input voltages (input voltages below the threshold voltage of the input transistors). A unique feature of this coupling scheme is it enables asymmetrical coupling between two nodes. For example, weight $G_{n,m}$ does not have to equal weight $G_{m,n}$. In other words, the system can be asymmetric, which would involve N(N-1) all-to-all connections.

Figure 6C:
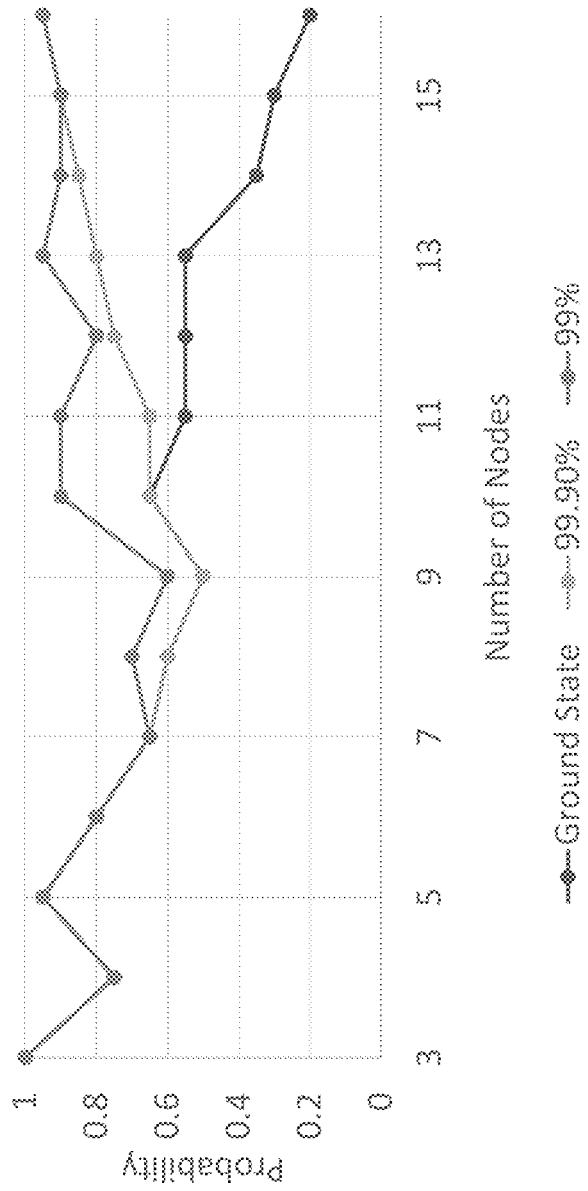
FIG. 6C shows results of SPICE simulations for reaching a solution state (within 99% of the ground state) in an all-to-all connected oscillator circuit with randomized weights.

FIG. 6C shows the results of a SPICE simulation of the differential coupling circuit of FIG. 6B with 16 fully connected oscillators with weighted connections. Random weights for all connections were scaled from 0 to 1 and run 20 times for node counts of 3 to 16. The results show the probability of reaching the ground state solution after a single run decreases with increasing number of nodes. However, the probability of achieving a solution within 99.9% of the ground state solution with a single run is 95%, with a system of 16 nodes. For certain applications, finding a solution close to the ground state is an acceptable solution if the calculation can be done quickly and locally.

All-to-All Optically Coupled Nonlinear Oscillators

Electronic oscillators can also be connected optically instead of electronically in an all-to-all coupling scheme. In an optical coupling scheme, each oscillator broadcasts an optical signal to every other oscillator and receives an optical signal from every other oscillator. These optical signals may be wavelength-, time-, or code-division multiplexed to ensure that each optical signal can be uniquely mapped to its source oscillator. Optical coupling is particularly advantageous because it can accommodate a large number of oscillators without increasing the resistive load on each oscillator like all-to-all resistive coupling schemes.

Figure 7:
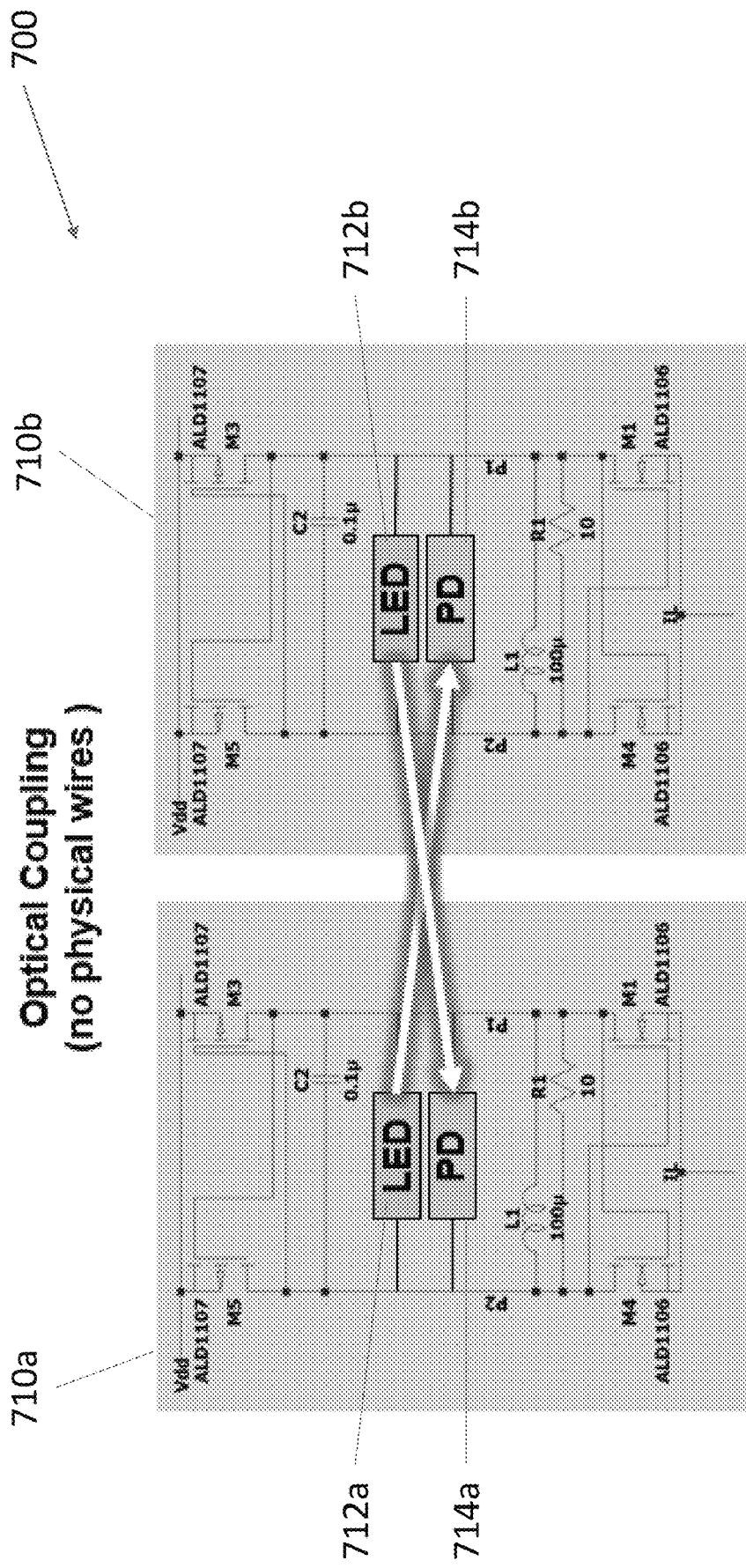
FIG. 7 illustrates optical coupling between a pair of LC oscillators.

FIG. 7 shows a pair 700 of optically coupled LC oscillators 710a and 710b. Each oscillator includes 710a (710b) or is coupled to a light source 712a (712b), such as light-emitting diode (LED) or vertical-cavity surface-emitting laser (VCSEL), to transmit the oscillation signal to the other oscillator 710b (710a), which uses a photodetector 714b (714a) to convert the oscillation signal into a current signal. Optical coupling eliminates physical wires, and its circuit configuration remains constant as the number of oscillators 710 grows, making it easier to scale than resistive coupling for oscillator interconnects.

Figures 8A, 8B:
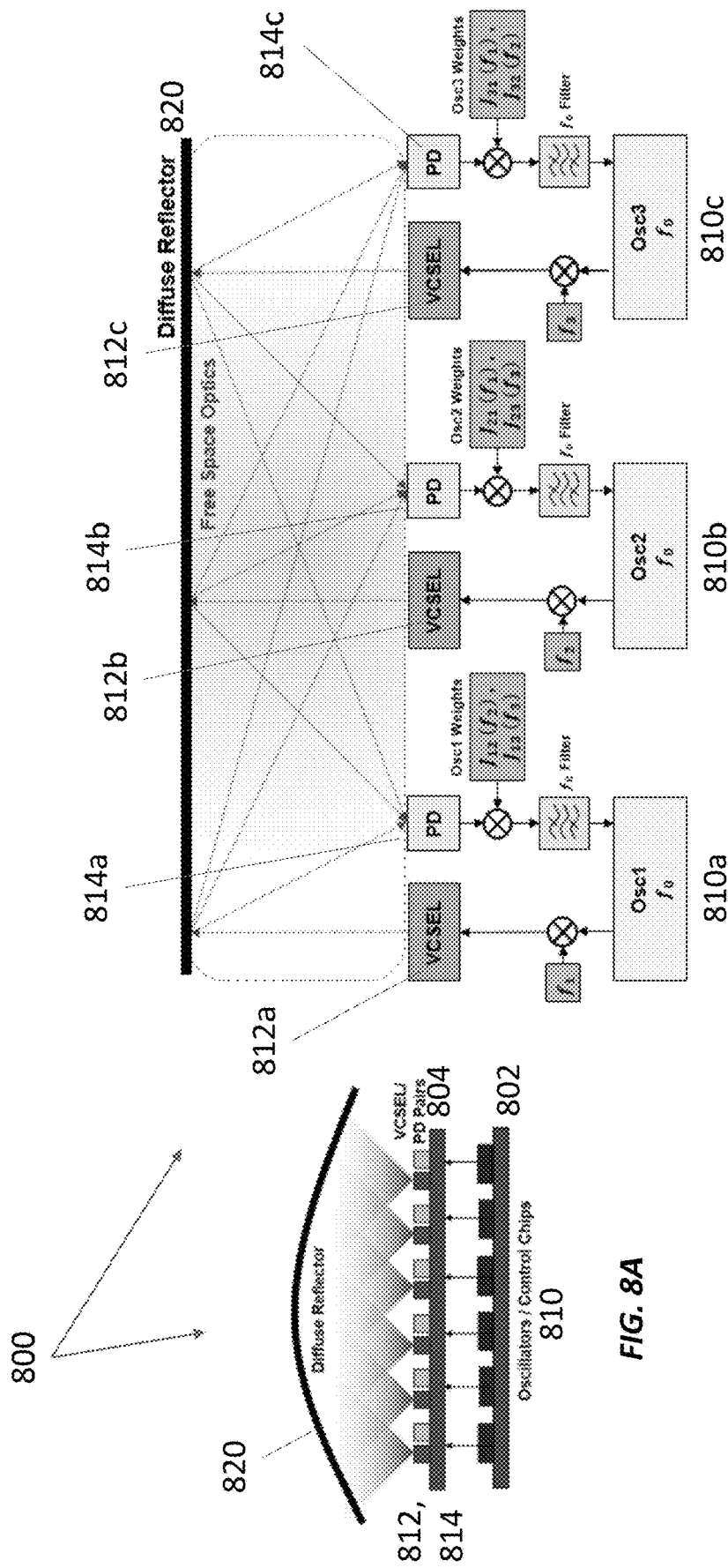
FIG. 8A shows an electronics layout with all-to-all free-space optical links connecting LC oscillators in an array of LC oscillators.
FIG. 8B is a detailed view of frequency-division multiplexing (FDM) circuitry in the electronics layout of FIG. 8A.
Figure 8C:
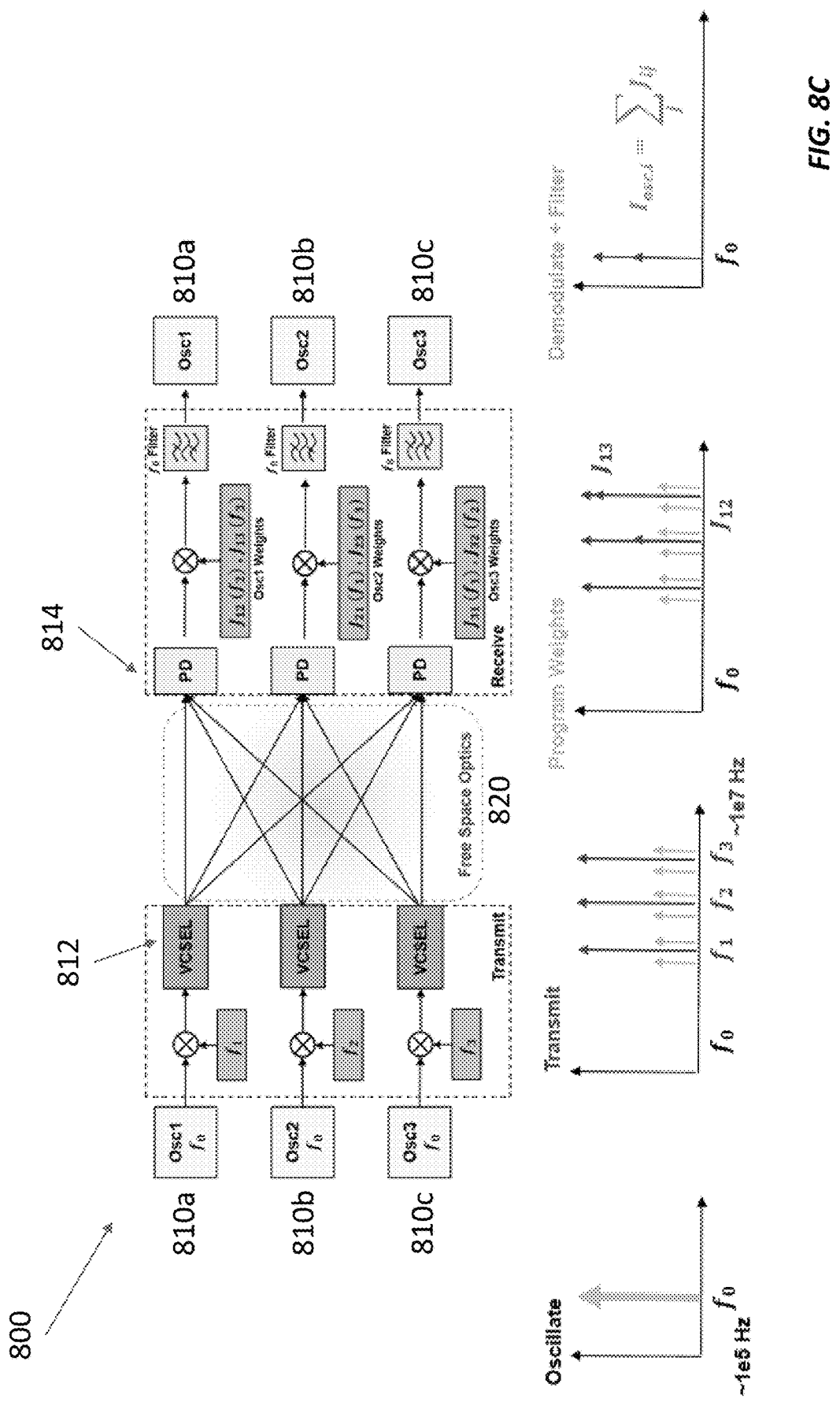
FIG. 8C is an unfolded view of all-to-all FDM communications among the LC oscillators in the LC oscillator array of FIG. 8A.

FIGS. 8A-8C illustrate an array 800 of optically interconnected nonlinear oscillators 810a-810c (collectively, oscillators 810) that can be used to solve Ising problems. FIG. 8A shows a profile view of the system 800, which has nonlinear oscillators 810 (e.g., LC oscillators) on a substrate 802, such as a printed circuit board or integrated circuit board. Each oscillator 810 can be driven by a voltage and an injection-locking signal as described above. The oscillators 810 can be arranged in a one- or two-dimensional array.

Each oscillator 810 is connected to a corresponding light source 812 (e.g., a VCSEL) and photodetector 814. For instance, the VCSELs 812 can be driven by a current source and the photodetectors 814 can deliver a current source, so they can be connected to the oscillators 810 by integrating a current source coupling into each oscillator circuit and using each VCSEL/photodetector pair to drive the current source. The light sources 812 and photodetectors 814 can be arranged in a one- or two-dimensional array on the same substrate 802 as the oscillators 810 or, as shown in FIG. 8A, on a separate substrate 804.

A parabolic diffuse reflector 820 opposite the light sources 812 and photodetectors 814 reflects light from the light sources 812 to the photodetectors 814. Here, the term "diffuse reflector" refers to an optical component or set of optical components that distributes the light from the light source 812 of one node 810 uniformly across the photodetectors 814 for the other nodes 810. (Variation in the optical intensity distribution may affect convergence to the ground state within a particular accuracy.) A diffuse reflector 820 can be implemented as a set of lenses, mirrors, diffractive optics, etc.

Together, the diffuse reflector 820, light sources 812, and photodetectors 814 provide all-to-all optical coupling for the oscillators 810. A given light source 812 emits a beam of light, which is modulated with a signal from the corresponding oscillator 810 and diverges as it propagates toward the diffuse reflector 820. The signal from oscillator is the full oscillator signal. The relative phase of this signal dictates whether it is spin 'up' or 'down,' but the entire signal is transmitted. The signal can be modulated onto the beam of light by modulating the amplitude of the current driving the light source 812.

The beams from different light sources are multiplexed, e.g., in time or wavelength or with different codes, so they can be distinguished from each other at the receivers. The diffuse reflector 820 scatters the beam of light over a range of angles back toward the photodetectors 814, which detect the light scattered by the diffuse reflector. Each photodetector 814 transduces the optical signal into an electrical signal, such as a photocurrent, that is weighted and then used to drive the corresponding oscillator 810.

FIGS. 8B and 8C show frequency-multiplexed connections among three of the oscillators 810a-810c in FIG. 8A in greater detail. (FIG. 8C shows an "unfolded" view of the system, with "free-space optics" representing reflection by the parabolic diffuse reflector 820 in FIGS. 8A and 8B.) Each oscillator 810 resonates at a baseline frequency, $f_0$, to produce a corresponding oscillator signal. Each oscillator 810 is coupled to a corresponding mixer that shifts the frequency of oscillator signal to its own frequency channel, $f_n$. Each oscillator's VCSEL 812 is then modulated with the $f_n$ signal and emits a modulated optical signal, which propagates through free space to the diffuse reflector 820.

The diffuse reflector 820 scatters the modulated optical signals to the photodetectors 814 coupled to the oscillators 810. Each photodetector 814 receives the modulated optical signals from all other oscillators 810 via the parabolic diffuse reflector 820. Because the oscillator signals are at distinct frequencies $f_1, f_2, f_3, \ldots, f_N$, they can be distinguished from each other using appropriate filters. Each received signal is sent through a filter where the weights are electronically programmed to modulate the amplitude of the individual oscillators 810, causing the weight filter output to be: $w_1 f_1 + w_2 f_2 + w_3 f_3 + \ldots + w_N f_N$. Each weight filter output is mixed down and filtered to the original oscillator frequency $f_0$, and injected into the corresponding oscillator 810.

The weights are set based on the problem being solved. The Jij parameters in the Ising Hamiltonian represent the coupling weights. These weights can be set as the strength of the filters for each receive node. The frequency of these filters represents the transmit node (oscillator 810) the signal is coming from, and the strength of the filter represents the weight. For the system settle to its lowest energy state, the coupling strengths (weights) should be either slowly and uniformly turned up or the injection signal to all of the oscillators 810 should be slowly turned up. The phases of the oscillators 810 will settle to a state which corresponds to the lowest energy state of the particular problem represented by the weights.

The photodetectors 814 should be fast enough to resolve the frequency-multiplexed signals. The exact photodetector bandwidth depends on the speed of the oscillator 810, the speed of the modulation, and the number of oscillators 810. If the modulation frequency is in the GHz range, then the photodetectors 814 should have GHz-scale bandwidths. As an example, consider oscillators 810 with a natural frequency $f_0$=10 kHz and photodetectors 814 with 1 GHz of available bandwidth. If the multiplexing spacing is equal to $2f_0$, then the photodetectors 814 can accommodate N=50,000 frequency bins, with one node (oscillator 810) per frequency bin.

The nonlinear oscillators 810 can communicate with each other via optical interconnects using other types of multiplexing, including time-division multiplexing (TDM), code-division multiplexing (CDM), or wavelength-division multiplexing (WDM). In TDM, for example, each oscillator 810 emits light only during a predetermined time slot. In CDM, the oscillator signals are modulated with distinct codes. And in WDM, the VCSELs 812 are replaced with lasers that emit light at distinct wavelengths.

Figure 9:
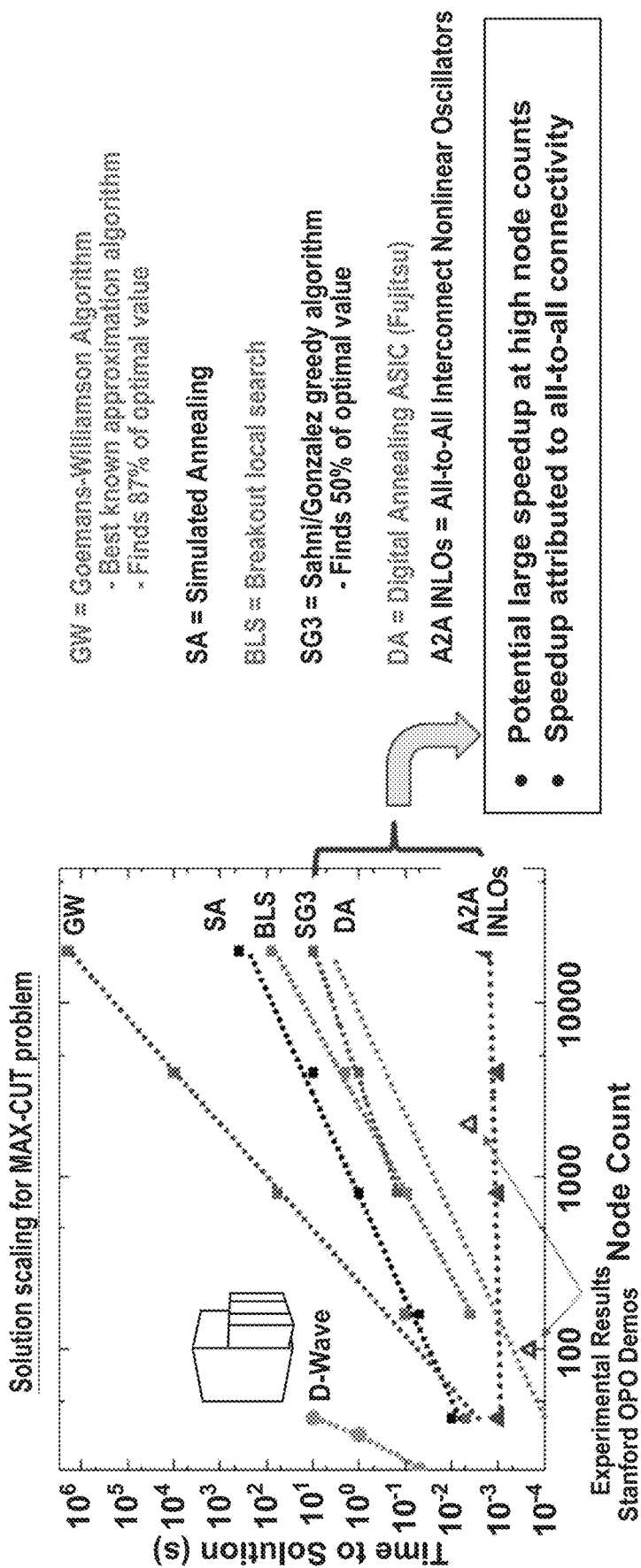
FIG. 9 illustrates performance advantages for solving the Max-Cut Problem of the all-to-all optical communications over electrical communications among oscillators in an oscillator array.

FIG. 9 illustrates estimated performance advantages of nonlinear oscillators with all-to-all interconnects over other approaches to solving the Max-Cut Problem, which is an NP-hard CO problem. As explained above, the Max-Cut Problem is the problem of finding a subset S of the vertex set of a graph such that the number of edges between S and the complementary subset is as large as possible. The plot in FIG. 9 shows that as the node count (number of oscillators) increases, the time to solution remains relatively flat with nonlinear oscillators (triangles), whereas the time to solution increases exponentially for other techniques. This robustness to increased node count is an advantage of an all-to-all connected Ising machine like the one shown in FIGS. 8A-8C.

Figure 10A:
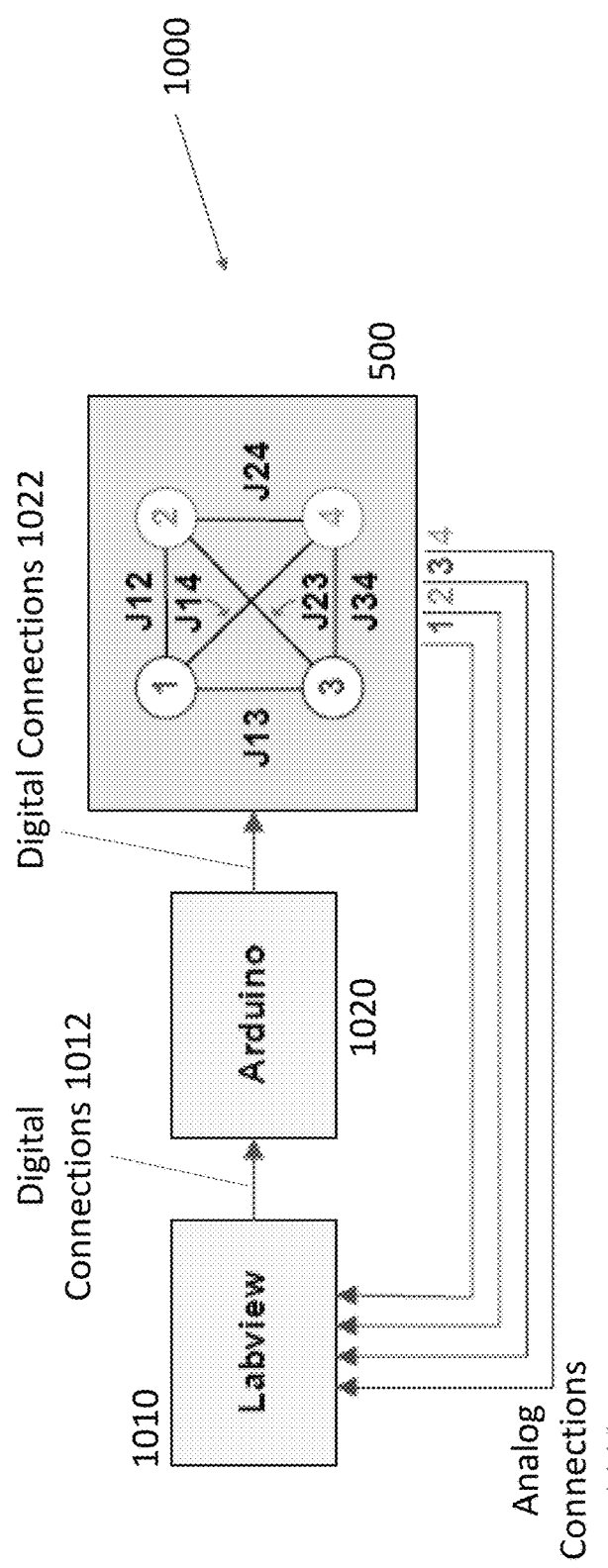
FIG. 10A shows a system-level diagram of a four-node oscillator control system.

Experimental Measurements of Differential and Fully Connected Nonlinear Oscillators FIG. 10A shows a schematic of an experimental setup 1000 for measuring performance of the four-node system 500 in FIG. 5A. A computer 1010 running a National Instruments LabVIEW program transmits user-defined digital potentiometer values for the differential analog multiply and accumulate circuit 510 (FIG. 5A) to a microcontroller (e.g., an Arduino Uno board) 1020 via digital connections 1012. The microcontroller 1020 then transmits the digital I2C resistor values to the six unique weights (J12-J34) via digital connections 1022. The analog oscillator voltage signals are monitored at a maximum sampling rate of 500 kHz via analog connections 1002 between the four-node system 500 and a data acquisition board in the computer 1010.

Figure 10B:
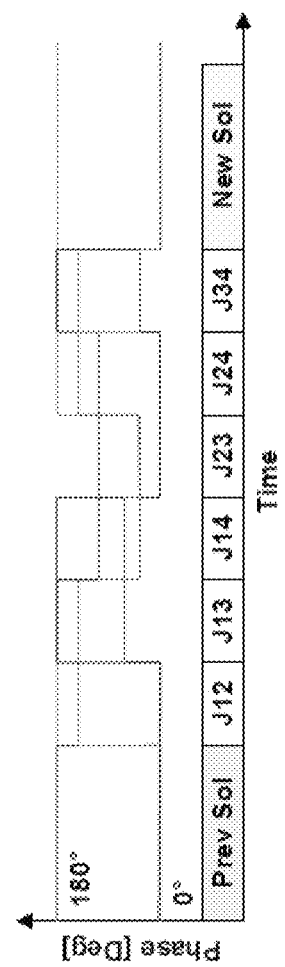
FIG. 10B is a schematic timing diagram of the oscillator phases during operation of the four-node oscillator control system of FIG. 10A.

FIG. 10B shows a phase-time trace of a single run by the four-node system 500 in the setup of FIG. 10A. The computer 1010 and microcontroller 1020 program the four-node system's digital potentiometers sequentially in time, due to the serial nature of the digital connections 1012 and 1022. The time period of the weight programming depends on the loop speed of the microcontroller 1020 and the complexity of the code, giving a maximum loop frequency of 117 kHz in this example. After the last weight (J34) is programmed, the oscillators (nodes) in the four-node system 500 arrive at the new solution state.

The phases of the oscillators are each measured relative to oscillator O1 (FIG. 5A), whose phase is given a default binary value of "0". The binary phase outputs are then rounded up or down with respect to a simple threshold: phases differences >90° with respect to oscillator 1 are assigned "1", and phases <90° are assigned "0". Unlike in simulations, no annealing of the coupling strength is required to arrive at the solution. Without being bound by any particular theory, this is likely due to the low node count of the system 500. With more nodes, simulations of an all-to-all coupled oscillator network using coupled differential equations show that ramping up either the coupling strength or an external super-harmonic injection locking signal cause the system to preferentially settle to the correct solution. The super-harmonic injection-locking signal serves two purposes: (1) it replaces the rounding feature described above, forcing the phases of each oscillator to their respective binary values (either 0° for "0" or 180° for "1"); and (2) it is used to extract sensible answers using systems with large node counts.

FIGS. 11A and 11B show phase measurements relative to oscillator O1 of the phase transitions of the oscillators in the four-node network 500 operating at 50 kHz and 5 kHz, respectively. The vertical dashed line in each plot indicates when the last potentiometer (J34) was digitally switched. The phases were obtained by performing a moving window Fourier transform on the time-domain amplitude signal. This measurement shows a 100 µs solution time, which translates to five cycles of the 50 kHz oscillators, as shown in FIG. 11A.

A potentially attractive pathway to scale the solution time of these systems involves simply increasing the oscillator frequency, as the settling time should scale with oscillator period. In an attempt to validate this hypothesis, FIG. 11B shows the same experiment but with oscillator frequencies reduced by one order of magnitude, to 5 kHz, by utilizing 10 µF capacitors. The time-to-solution also increases by approximately one order of magnitude, which suggests that the time-to-solution does indeed scale with the oscillator frequencies. The 90° threshold translates the final oscillator phase states to a binary solution of [0 1 1 0] using the order of the oscillator number. This solution is one of the six correct degenerate solutions for a fully-connected MAX-CUT problem with four nodes and equal connection weights.

FIGS. 12A-12E show the experimentally measured oscillator states (left) with the differential coupling circuit in the four-node system 500. Both the measured time-dependent amplitude data (upper right) and phase data (lower right) are shown for each connection scheme. The amplitudes of the oscillators are shifted by 10 V in each amplitude plot to help distinguish each individual oscillator signal. The phases are relative to oscillator 1 (bottom trace), thus oscillator O1 is defined with a phase of 0°. The AC and DC injection-locking signal into transistor M3 alternated between an "off" voltage of 0 V, and an "on" voltage of $V_{inj}=1+\sin(ft)$, where f is at 100 kHz (twice the oscillator's natural resonance frequency of 50 kHz). The various spike signals in the phase plots indicate when the injection-locking signal was in the "off" state. The injection-locking signal was alternated 50 times for each combination.

Figure 12A:
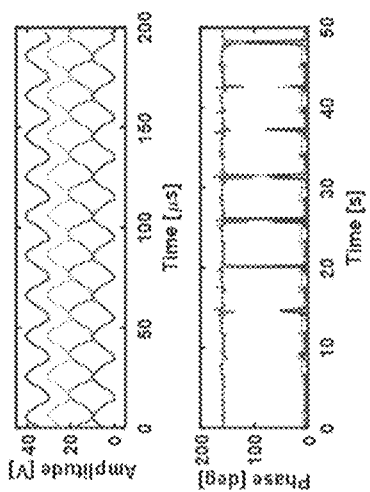
FIGS. 12A-12E show measured oscillator amplitude data at different binary weight configurations for the four-node oscillator control system of FIG. 10A.
Figure 12B:
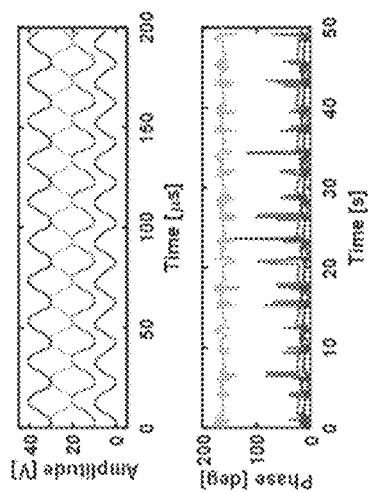
Figure 12C:
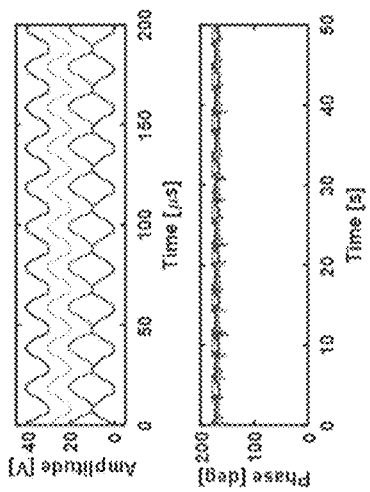
Figure 12D:
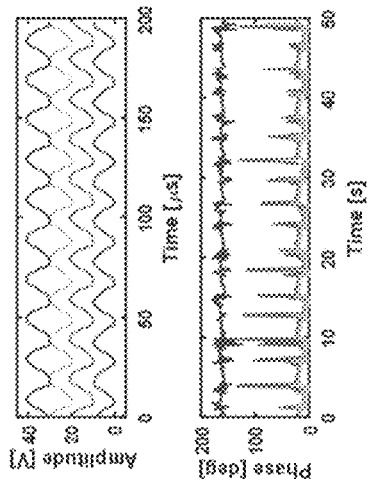

The binary weights connecting the oscillators O1-O4 in FIGS. 12A-12D are set that such that only one node is connected to the other three nodes (e.g., node O1 is connected to nodes O2-O4 in FIG. 12A, and nodes O2-O4 are connected only to node O1). With the binary weights shown in FIGS. 12A-12D, each oscillator can be made to be 180° out of phase with all other oscillators in the system. With this graph structure of only one node connected to the remaining three, it intuitively follows that the energy minimization is achieved when the central node is out of phase with the others.

Figure 12E:
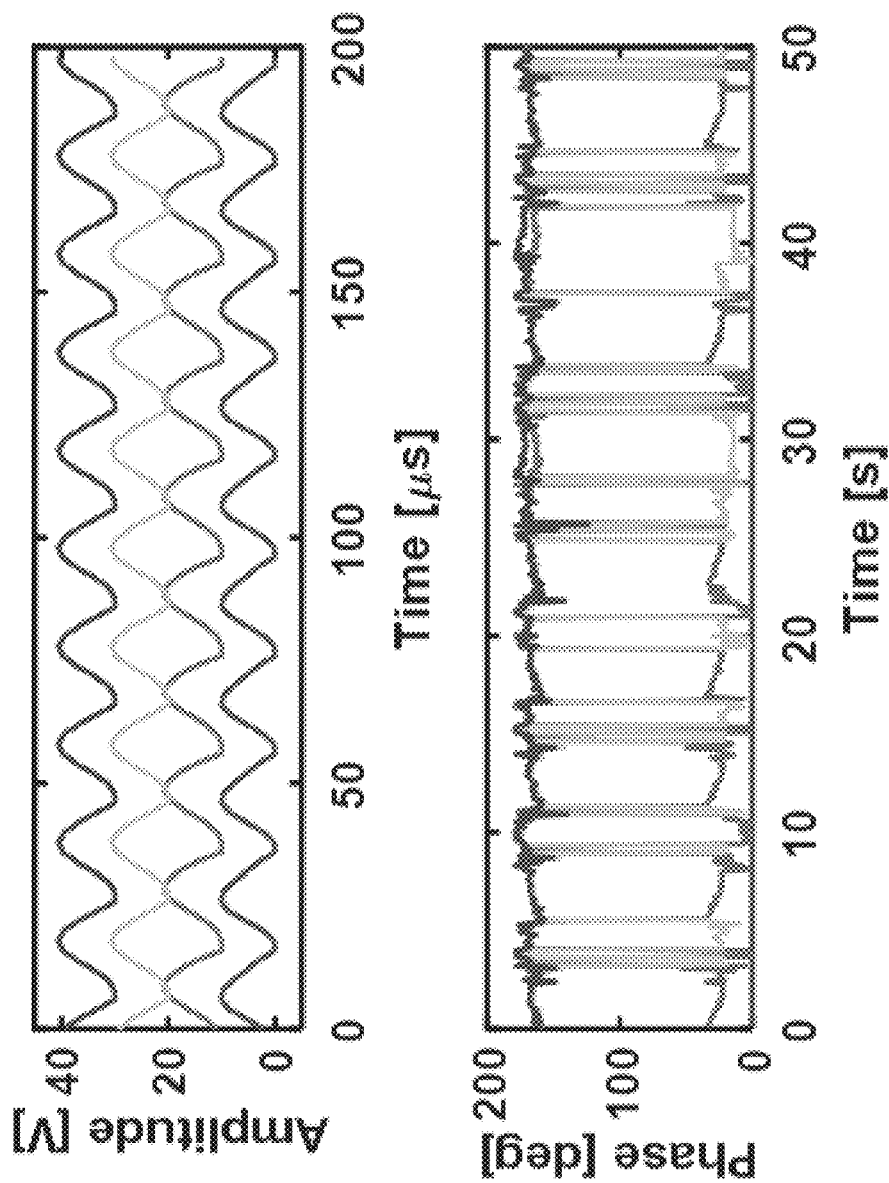
Figure 12E:
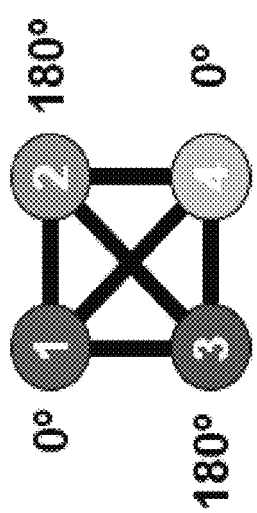

FIG. 12E illustrates the case where are all four nodes are fully connected (i.e., all six binary connection weights are set to 1). According to the Ising Hamiltonian, a total of six degenerate states are possible with this weight setting. Because the phases in this experiment are relative to oscillator O1, there are three possible degenerate solutions of the four oscillators: {0°, 0°, 180°, 180°}, {0°, 180°, 180°, 0°}, and {0°, 180°, 0°, 180°}. After 1000 trials, state {0°, 0°, 180°, 180°} is achieved 91.6% of the time and state {0°, 180°, 0°, 180°} is achieved 8.4% of the time. No incorrect solutions were achieved.

The following table shows a summary of the experimental connections tested, as well as their corresponding ground-state yield. All of the connections achieved their ground state solutions 100% of the time.

| Connection Scheme $\{J_{1,2}, J_{1,3}, J_{1,4}, J_{2,3}, J_{2,4}, J_{3,4}\}$ | Number of Trials | Ground-State Yield |
|---|---|---|
| {1, 1, 1, 0, 0, 0} | 50 | 100% |
| {1, 0, 0, 1, 1, 0} | 50 | 100% |
| {0, 1, 0, 1, 0, 1} | 50 | 100% |
| {0, 0, 1, 0, 1, 1} | 50 | 100% |
| {1, 1, 1, 1, 1, 1} | 1000 | 100% |

Statistical Analysis of All-to-All Coupled Oscillator Network Performed

Figure 13B:
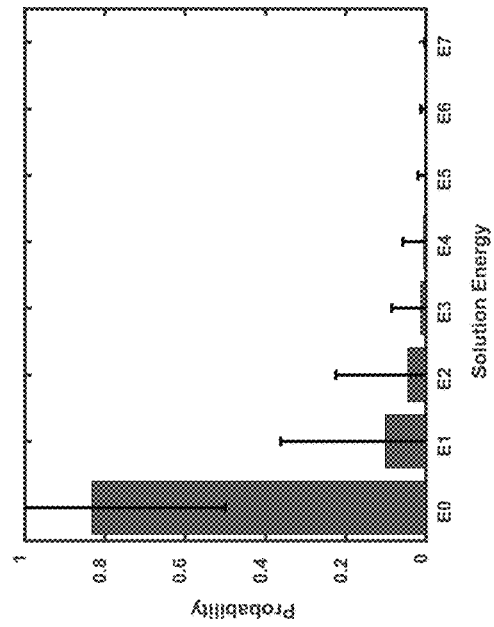
FIGS. 13A and 13B show experimentally measured probability of solution energy for 1-bit and 5-bit weight resolutions, respectively, after more than 2000 trials with random weights.
Figure 13D:
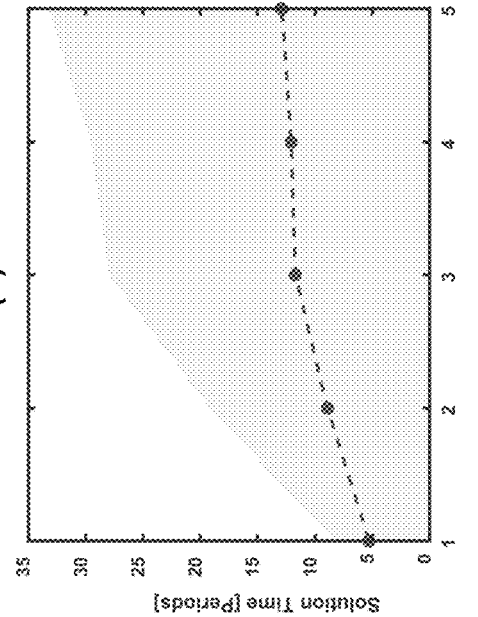
FIG. 13D shows the estimated solution time in number of oscillator periods based on a 99% confidence (the corresponding shaded regions represent the standard deviation).
Figure 13A:
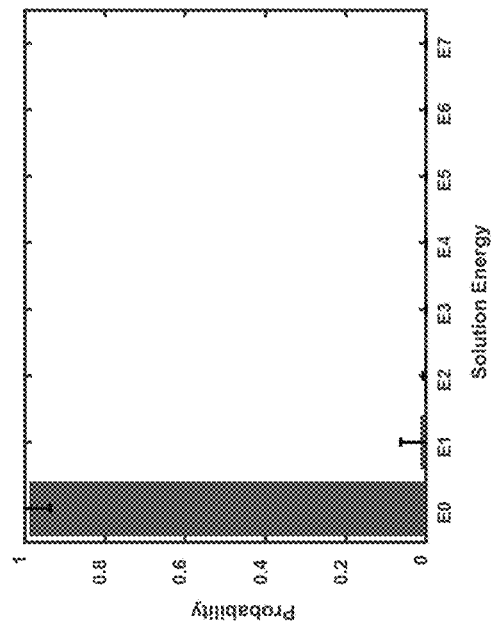
Figure 13C:
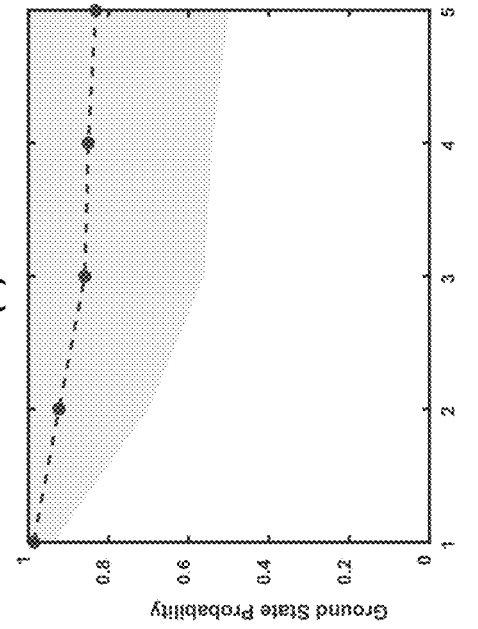
FIG. 13C shows the measured ground state probability versus weight bit resolution.

FIGS. 13A-13C illustrate statistical analyses of the accuracy and reliability of the system over more than 2000 automated computer-controlled experiments with random weights. FIGS. 13A and 13B show the probability distributions of the arrival of each solution energy with 1-bit and 5-bit weight values, respectively. The probabilities of achieving the ground state for 1-bit and 5-bit weights are 98% and 84%, respectively. The ground state probabilities were determined by 10 trials of each of the 2000 randomly generated problems. The data show that the probability of achieving the ground state decreases with increasing weight bit resolutions. The solutions for all of the experiments follow a Boltzmann distribution with the peak of the curve at the ground state.

FIG. 13C shows the results of running over 2000 random problems for weight bit resolutions from 1 to 5. These results characterize the ground state solution probability versus weight bit resolution. The ground state accuracy decreases monotonically as the bit resolution increases. The total number of oscillator periods, $N_T$, to reach ground state with 99% certainty is defined as $N_T = N_c \log(1-0.99)/\log(1-P(b))$. Here, P(b) is the measured ground state probability from a single run for bit resolution b, and $N_c$ is the number of oscillator periods for a single run. The measured ground state probability P(b) is from FIG. 13A and is plotted in FIG. 13D. Thus, it takes an average of 13 periods to achieve the ground state with 5 bits of weight resolution.

Figure 14:
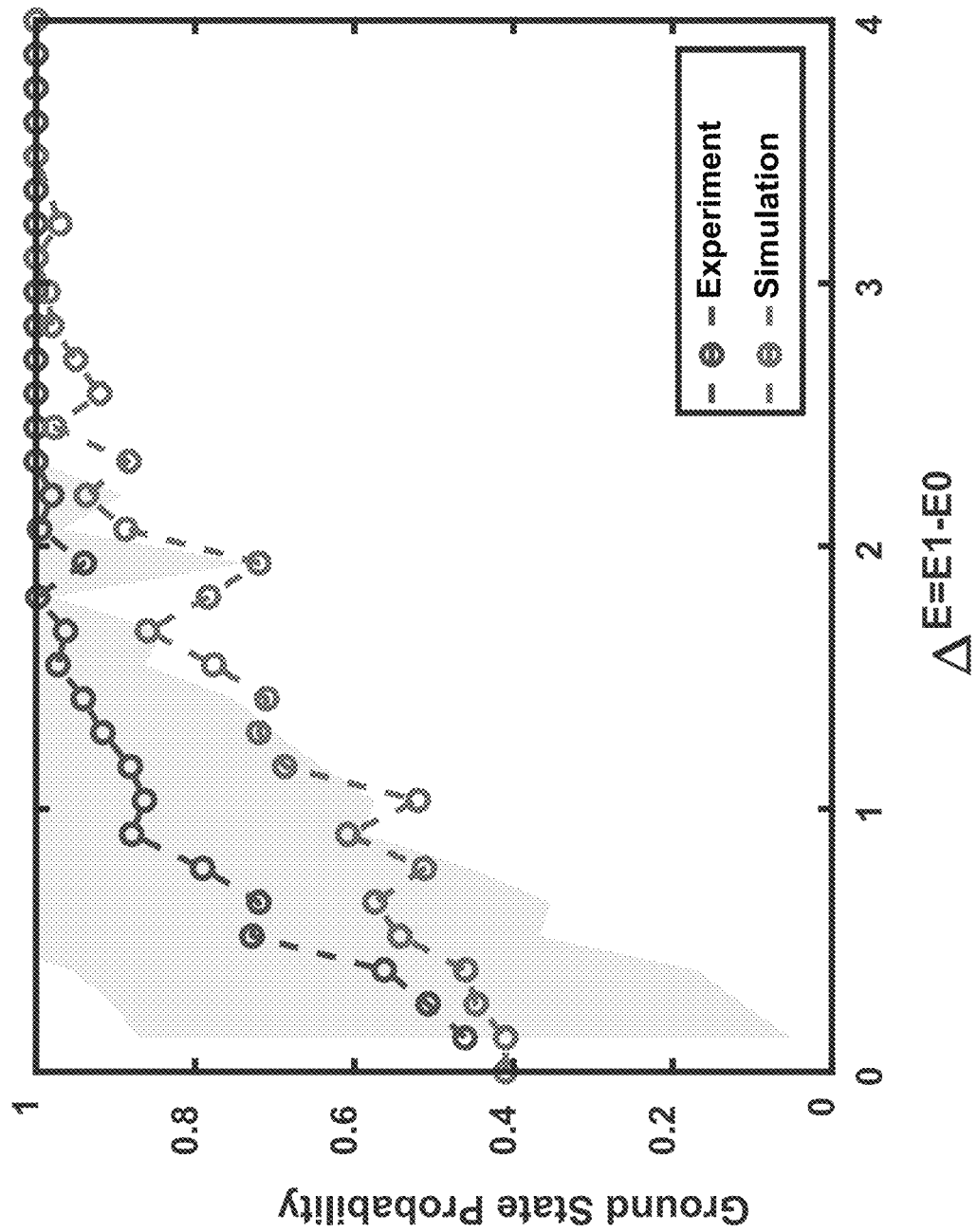
FIG. 14 shows the experimentally measured ground state probability versus solution energy difference between the ground state Ising energy and the next highest energy state ($\Delta E = E1 - E0$) for randomly generated 5-bit weights.

FIG. 14 is a plot of the measured ground state probability versus the difference between the ground state Ising energy and the next highest energy state ($\Delta E = E1 - E0$) for randomly generated problems with 5-bit weights. Intuitively, this energy difference characterizes the depth of the ground state potential well, with easier problems exhibiting large $\Delta E$, and more difficult problems exhibiting small $\Delta E$. FIG. 14 shows that as $\Delta E$ decreases, the probability of finding the ground state on a single trial also decreases. For example, when $\Delta E < 2$, the probability of achieving the ground state falls below 0.9. Noise in the system causes difficulty in distinguishing energy-near solutions from the ground state solution. The minimum $\Delta E$ value inversely scales with weight bit resolution, which is the cause of the decreased accuracy for higher bit problems.

Alternatively, binary weight systems typically have very high ground state probabilities due to the large $\Delta E$ values. For example, in the four-node binary weight system shown in FIG. 5A, the minimum energy difference between E1 and E0 is $\Delta E = 2$, which gives rise to very high accuracy solutions. The absence of non-unitary probabilities for $\Delta E > 2$ implies that the system does not become trapped in local minimum so long as the $\Delta E$ is large enough.

FIG. 14 shows both experimental results (upper trace) and simulations (lower trace). These simulated results were generated by simulating a set of randomly generated 5-bit weight problems with the stochastic differential equation (SDE) simulation technique described above. The simulated sample set includes 1000 different problems, and each point represents the mean ground state probability value of the problems with a given $\Delta E$ value. The behavior of the SDE simulated system matches reasonably well to the behavior measured experimentally.

Oscillator Network Scaling

To understand the expected performance as the system size is scaled, the SDE solver discussed above was extended beyond the case of four nodes (V=4) and used to calculate the probability that the system can find the ground state as a function of the number of nodes V. For this scaling study, the annealing schedule described in Eq. (3) was used with $\tau = 5$ cycles. This value was chosen to be small to allow for a pessimistic assumption of the solution time scaling trends. The problem set for this test was a set of circular graphs, known as Mobius ladder graphs, with each node connected to its two nearest neighbors and one node directly opposite (shown in the inset of FIG. 15A). A deterministic solution to find the ground state of this problem set exists, which allows for the solution from the SDE solver to be compared against a global energy minimum.

Figures 15A, 15B:
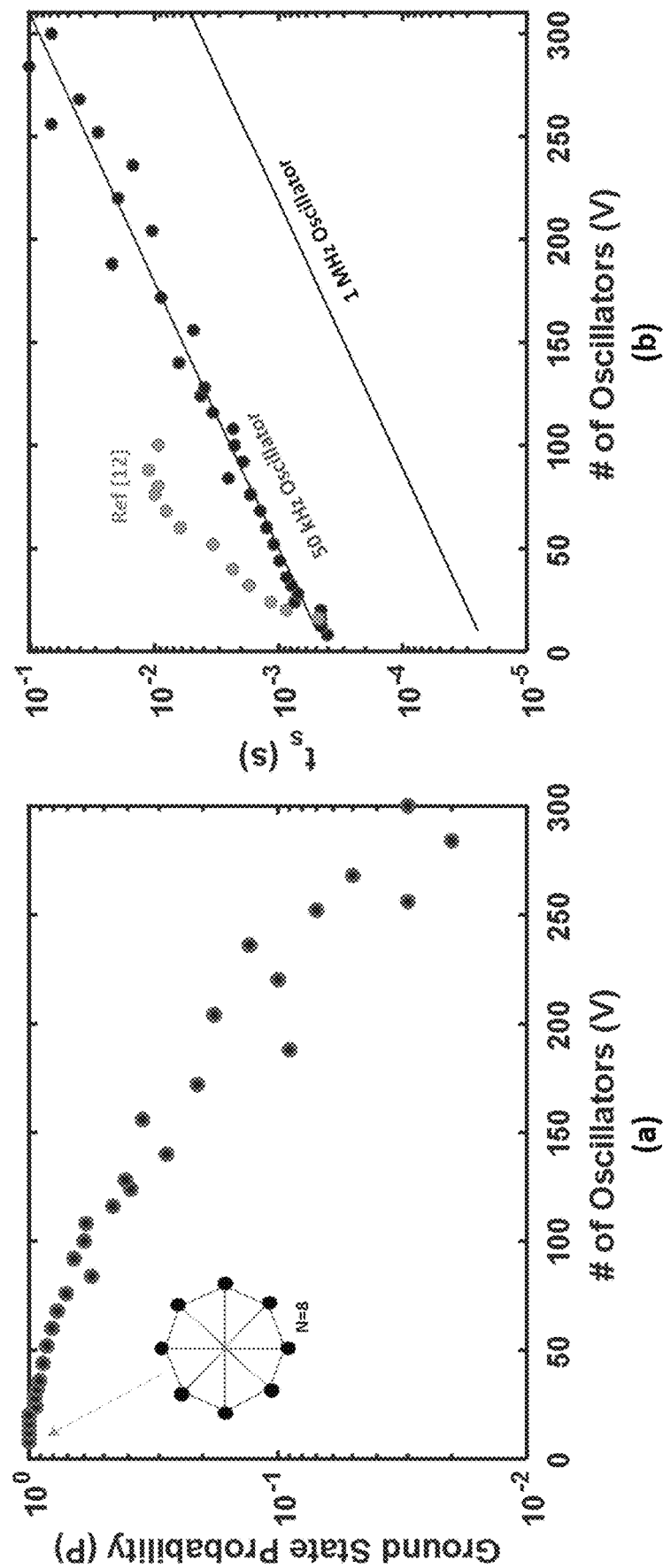
FIG. 15A shows the simulated ground state probability on a circular graph versus number of oscillators.
FIG. 15B shows a scaling simulation of the coupled oscillator system with 50 kHz and 1 MHz oscillator frequencies.

FIG. 15A is a plot of the probability P that the system reaches the ground state solution after 500 independent runs for each problem set, showing a natural roll-off from about 100% ground state probability when V=8 to roughly 3% probability when V=300. Translating these results to calculate the overall time to find a solution for a given problem ($t_s$), we first find the number of trials $N_t$ by defining $N_c$ as the number of oscillation periods (cycles) for a single run of the simulated system to reach a minimum value and multiplying by the number of trials to reach the ground state based on the expected probability P (as described above). Finally, multiplying the number of trials $N_t$ by the period of one oscillation yields the final solution time $t_s$.

FIG. 15B shows these computed solution times for a system built with 50 kHz oscillators (to match the experimental circuit), along with a linear fit to a logarithmic trend line. The results are compared against the identical problem set and a similar analysis from previous Ising machine implementations. For illustrative purposes, a similar trend line is plotted for a system operating at an oscillator frequency of 1 MHz. FIGS. 11A and 11B show direct scaling with oscillator frequency, and the additional line in FIG. 15B highlights the potential speed increase that can be achieved against existing implementations with relatively modest hardware specifications. This scaling analysis focuses entirely on ground state solutions. As shown in FIG. 13B, when the ground state solution is not reached, the system often settles to a value very close to the absolute minimum, which can be sufficient for many optimization problems.

This analysis can be extended beyond simple Mobius ladder graph problems to randomized cubic graphs, where each node is connected to three others with the connections determined at random. For each node size, 100 different problem instances were generated, and the exact ground state was found using the BiqMac MAX-CUT solver. Each problem set was then run 100 times using the coupled oscillator simulator, and the ground state probability (P) and solution time ($t_s$) were determined as described previously.

Figure 16:
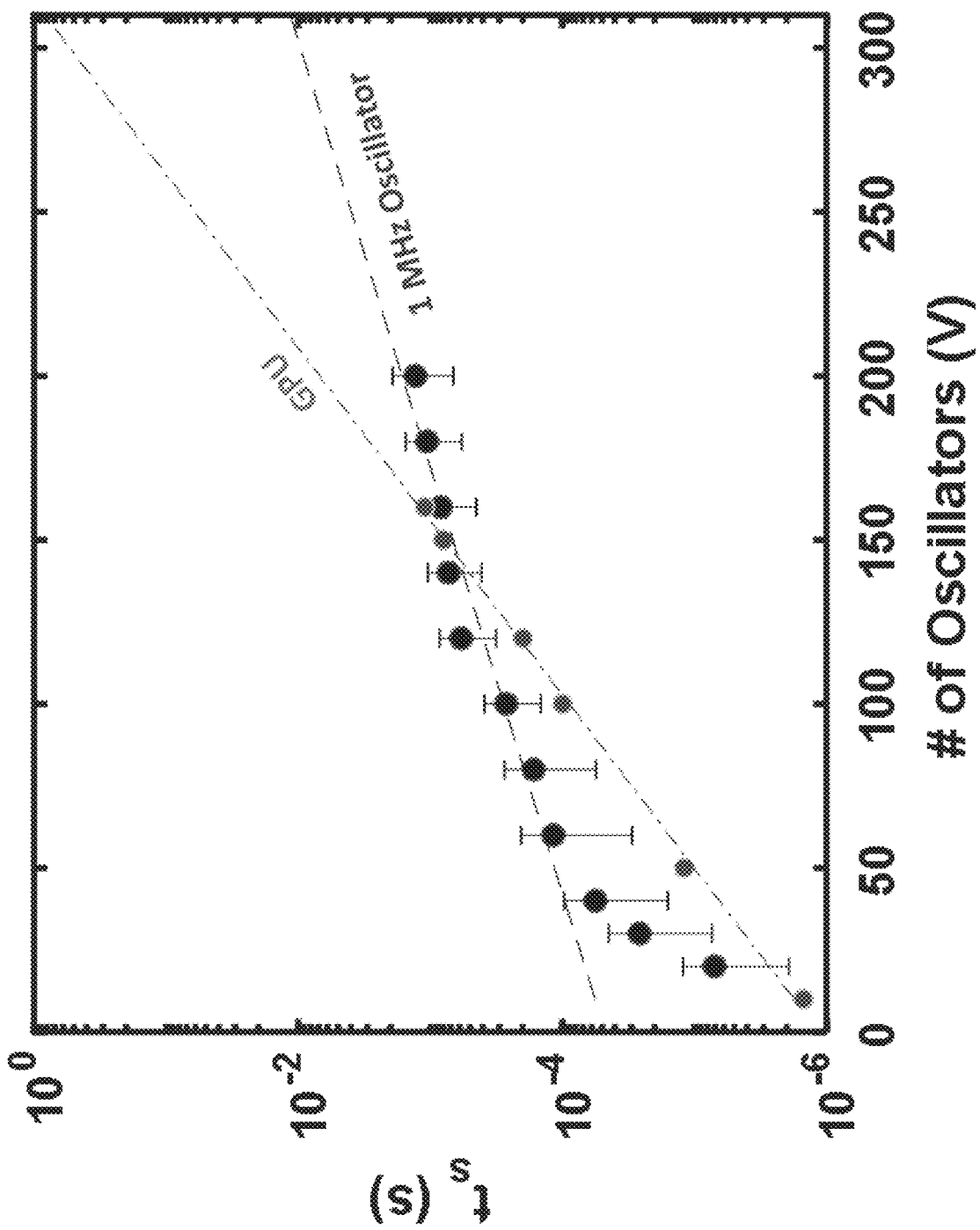
FIG. 16 shows solution time scaling simulation for randomized cubic graphs using coupled oscillators and a mean-field algorithm run on a conventional graphics processing unit (GPU) (dashed lines represent log-linear fits to the respective data).

FIG. 16 shows the mean solution time $t_s$ calculated for all 100 problem sets at each node size, assuming a 1 MHz oscillator. The data are plotted against an identical experiment on cubic graphs solved using a GPU-accelerated mean-field algorithm, which is about twenty times faster than other Ising machine implementations. The simulation results show that a crossover point occurs at $V \approx 150$, with the coupled oscillator approach trending much more favorably as the system size is scaled. As a point of reference, the BiqMac solver running on a modern CPU took approximately 10-20 seconds to solve random cubic problem instances with V=200. This analysis lends credibility to the promise of using coupled oscillator systems to solve non-trivial computational problems.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A system for solving a combinatorial optimization problem, the system comprising:
    a network of nonlinear electronic oscillators, wherein each nonlinear electronic oscillator in the network of nonlinear electronic oscillators is differentially coupled to each other nonlinear electronic oscillator in the network of nonlinear electronic oscillators and configured to receive a coherent sum of oscillating signals from the other nonlinear electronic oscillators in the network of nonlinear electronic oscillators;
    circuitry to weight the oscillating signals with independently tunable weights based on the combinatorial optimization problem; and
    an oscillator, operably coupled to each nonlinear electronic oscillator in the network of nonlinear electronic oscillators, to inject a super-harmonic injection-locking signal into each nonlinear electronic oscillator in the network of nonlinear electronic oscillators, the super-harmonic injection-locking signal causing the oscillating signal emitted by each nonlinear electronic oscillator to settle to a corresponding phase,
    wherein adjusting at least one of the super-harmonic injection-locking signal or the independently tunable weights causes the corresponding phases of the nonlinear electronic oscillators to settle to a state corresponding to a lowest energy state of the combinatorial optimization problem.

2. The system of claim 1, wherein a first nonlinear electronic oscillator in the network of nonlinear electronic oscillators comprises an injection-locked frequency divider circuit.

3. The system of claim 2, wherein the injection-locked frequency divider circuit comprises:
    a resonant circuit;
    a first transistor, in series with the resonant circuit, having a first gate to receive a first input from a second nonlinear electronic oscillator in the network of nonlinear electronic oscillators, the first input driving the resonant circuit; and
    a second transistor, in series with the resonant circuit, having a second gate to receive a second input from the second nonlinear electronic oscillator, the second input driving the resonant circuit.

4. The system of claim 3, wherein the resonant circuit comprises a pair of cross-coupled transistors in series with a pair of inductors and capacitors.

5. The system of claim 3, wherein the resonant circuit is configured to provide a first output and a second output to the second nonlinear electronic oscillator.

6. The system of claim 1, further comprising:
a filter, operably coupled to an input of a first nonlinear electronic oscillator in the network of nonlinear electronic oscillators, to remove a direct current (DC) portion of the coherent sum of oscillating signals from the other nonlinear electronic oscillators in the network of nonlinear electronic oscillators.

7. The system of claim 1, wherein the circuitry is configured to provide an asymmetrically weighted connection between a first nonlinear electronic oscillator and a second nonlinear electronic oscillator in the network of nonlinear electronic oscillators.

8. The system of claim 1, wherein the circuitry comprises independently tunable potentiometers.

9. The system of claim 1, wherein the circuitry comprises multiply and accumulate circuits with independently tunable gains.

10. The system of claim 9, wherein each multiply and accumulate circuit comprises a buffer circuit.

11. The system of claim 1, further comprising:
a plurality of light sources, each light source in the plurality of light sources operably coupled to a corresponding nonlinear electronic oscillator in the plurality of nonlinear electronic oscillators and configured to transmit the corresponding oscillating signal as a multiplexed optical signal;
a diffuse reflector in optical communication with the plurality of light sources and configured to scatter respective portions of the multiplexed optical signals; and
a plurality of photodetectors configured to receive the respective portions of the multiplexed optical signals, each photodetector in the plurality of photodetectors operably coupled to a corresponding nonlinear electronic oscillator in the plurality of nonlinear electronic oscillators.

12. A method for solving a combinatorial optimization problem, the method comprising:
at each nonlinear electronic oscillator in a network of nonlinear electronic oscillators in which each nonlinear electronic oscillator is differentially coupled to each other nonlinear electronic oscillator:
emitting an oscillating signal;
receiving a coherent sum of the oscillating signals from all of the other nonlinear electronic oscillators in the network of nonlinear electronic oscillators;
injecting an injection-locking signal from an oscillator into each nonlinear electronic oscillator in the network of nonlinear electronic oscillators, the injection-locking signal causing the oscillating signal emitted by each nonlinear electronic oscillator to settle to a corresponding phase;
at each nonlinear electronic oscillator in the network of nonlinear electronic oscillators, weighting the coherent sum by a corresponding independently tunable weight based on the combinatorial optimization problem; and
adjusting at least one of the injection-locking signal or the corresponding independently tunable weights so as to cause the corresponding phases of the nonlinear electronic oscillators to settle to a state corresponding to a lowest energy state of the combinatorial optimization problem.

13. The method of claim 12, further comprising:
illuminating a diffuse reflector with a first multiplexed optical signal from a first nonlinear electronic oscillator in the network of nonlinear electronic oscillators, the diffuse reflector scattering respective portions of the first multiplexed optical signal to the other nonlinear electronic oscillators in the network of nonlinear electronic oscillators; and
wherein receiving the coherent sum of the oscillating signals comprises, at each of the other nonlinear electronic oscillators in the network of nonlinear electronic oscillators,
de-multiplexing the portion of the first multiplexed optical signal to form a first oscillator signal,
weighting the first oscillator signal with a corresponding first independently tunable weight to form a corresponding first weighted signal, and
injecting the corresponding first weighted signal into the other nonlinear electronic oscillator.

14. The method of claim 13, further comprising:
generating, by the first nonlinear electronic oscillator, a first oscillator signal;
shifting the first oscillator signal by a first unique frequency shift to produce a first frequency-shifted oscillator signal; and
modulating a light source with the first frequency-shifted oscillator signal to produce the first multiplexed optical signal.

15. The method of claim 13, further comprising:
illuminating the diffuse reflector with a second multiplexed optical signal from a second nonlinear electronic oscillator in the network of nonlinear electronic oscillators, the diffuse reflector scattering respective portions of the second multiplexed optical signal to the other nonlinear electronic oscillators; and
wherein receiving the coherent sum of the oscillating signals comprises, at each of the other nonlinear electronic oscillators in the network of nonlinear electronic oscillators,
de-multiplexing the portion of the second multiplexed optical signal to form a corresponding second oscillator signal,
weighting the corresponding second oscillator signal with a corresponding second independently tunable weight to form a corresponding second weighted signal, and
injecting the corresponding second weighted signal into the nonlinear oscillator.

\* \* \* \* \*